US011117487B2

(12) United States Patent
Al-Awami et al.

(10) Patent No.: US 11,117,487 B2
(45) Date of Patent: Sep. 14, 2021

(54) COMMUNICATION-FREE CHARGE CONTROLLER FOR ELECTRIC VEHICLES

(71) Applicant: King Fahd University of Petroleum and Minerals, Dhahran (SA)

(72) Inventors: Ali Taleb T. Al-Awami, Dhahran (SA); Saifullah Shafiq, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 111 days.

(21) Appl. No.: 16/408,005

(22) Filed: May 9, 2019

(65) Prior Publication Data

US 2020/0353835 A1 Nov. 12, 2020

(51) Int. Cl.

| | |
|---|---|
| ***B60L 53/66*** | (2019.01) |
| ***B60L 53/16*** | (2019.01) |
| ***G01R 31/382*** | (2019.01) |
| ***B60L 53/62*** | (2019.01) |

(52) U.S. Cl.

CPC ............. *B60L 53/665* (2019.02); *B60L 53/16* (2019.02); *B60L 53/62* (2019.02); *G01R 31/382* (2019.01)

(58) Field of Classification Search

CPC ........ B60L 53/665; B60L 53/16; B60L 53/62; B60L 53/63; B60L 53/12; G01R 31/382; G01R 31/385

See application file for complete search history.

(56) References Cited

U.S. PATENT DOCUMENTS

| | | | | |
|---|---|---|---|---|
| 9,616,763 | B2 | 4/2017 | Al-Awami et al. | |
| 2013/0257372 | A1* | 10/2013 | Chen | H02J 13/00034 320/109 |
| 2014/0253036 | A1 | 9/2014 | Kinomura | |

(Continued)

FOREIGN PATENT DOCUMENTS

| | | |
|---|---|---|
| CN | 108075200 A | 5/2018 |

OTHER PUBLICATIONS

Choi, et al. ; Optimal Charging Strategy Based on Model Predictive Control in Electric Vehicle Parking Lots Considering Voltage Stability ; MDPI Energies ; Jul. 11, 2018 ; 17 Pages.

(Continued)

*Primary Examiner* — David V Henze-Gongola
(74) *Attorney, Agent, or Firm* — Oblon, McClelland, Maier & Neustadt, L.L.P.

(57) ABSTRACT

An electric vehicle charge controller and charging method for controlling a charging rate for a battery of an electric vehicle is presented. The battery receives charge via a node connected to a power distribution source. The charge controller receiving a nodal voltage measurement for voltage at the node, receiving a value of electric power at the node, and determining a change in the electric power value based on a previous electric power value. When the change in electric power is greater than a load change threshold, the charge controller determines an estimate of voltage-to-load sensitivity. The charge controller determines the charging rate of the electric vehicle based on the nodal voltage, the determined voltage-to-load sensitivity, and a state of charge of the at least one battery, and controls the charging rate for the at least one battery in accordance with the determined charging rate.

20 Claims, 24 Drawing Sheets

(56) References Cited

U.S. PATENT DOCUMENTS

2016/0257216 A1* 9/2016 Al-Awami .............. B60L 58/22

OTHER PUBLICATIONS

Mao, et al. ; A new schedule-controlled strategy for charging large number Of EVs with load shifting and voltage regulation ; IEEE PES Asia-Pacific Power and Energy Engineering Conference (APPEEC) ; 2015 ; 5 Pages.
Sansawatt, et al. ; Smart Decentralized Control of DG for Voltage and Thermal Constraint Management ; IEEE Transactions on Power Systems, vol. 27, No. 3 ; Aug. 2012 ; 9 Pages.
Richardson, et al. ; Optimal Charging of Electric Vehicles in Low-Voltage Distribution Systems ; IEEE Transactions on Power Systems, vol. 27, No. 1 ; Feb. 2012 ; 12 Pages.
Luo, et al. ; Real-time scheduling of electric vehicles charging in low-voltage residential distribution systems to minimise power losses and improve voltage profile ; IET Generation, Transmission & Distribution ; Aug. 20, 2013 ; 14 Pages.
Zhang, et al. ; A Novel Voltage Sensitivity Approach for the Decentralized Control of DG Plants ; IEEE Transactions on Power Systems ; 2017 ; 11 Pages.
Murphy, et al. ; Optimised Voltage Control for Distributed Generation ; Electricity Research Centre ; 6 Pages.
Weckx, et al. ; Voltage Sensitivity Analysis of a Laboratory Distribution Grid With Incomplete Data ; IEEE Transactions on Smart Grid vol. 6, No. 3 ; May 2015 ; 10 Pages.
Zhou, et al. ; Simplified Calculation of Voltage and Loss Sensitivity Factors in Distribution Networks ; $16^{th}$ PSCC ; Jul. 14-18, 2008 ; 6 Pages.
Valverde, et al. ; Model Predictive Control of Voltages in Active Distribution Networks ; IEEE Transactions on Smart Grid, vol. 4, No. 4 ; Dec. 2013 ; 10 Pages.
Al-Awami, et al. ; Electric Vehicle Charging Modulation Using Voltage Feedback Control ; 2013 ; 5 Pages.
Akhtar, et al. ; Autonomous Electric Vehicle Charging Management over Real Time Digital Simulator ; 2014 ; 5 Pages.
Faddel, et al. ; Real Time Digital Simulation of Voltage-Based Controller for Electric Vehicle Charging ; 2016 ; 5 Pages.
Al-Awami, et al. ; A Voltage-Based Controller for an Electric-Vehicle Charger ; IEEE Transactions on Vehicular Technology, vol. 65, No. 6 ; Jun. 2016 ; 12 Pages.
Richardson, et al. ; Local Versus Centralized Charging Strategies for Electric Vehicles in Low Voltage Distribution Systems ; IEEE Transactions on Smart Grid, vol. 3, No. 2 I Jun. 2012 ; 9 Pages.

* cited by examiner

COMMUNICATION-FREE CHARGE CONTROLLER FOR ELECTRIC VEHICLES

BACKGROUND

Technical Field

The present disclosure is directed to a charge controller, charge system and charging method for electric vehicles that takes into account voltage-to-load sensitivity without communication via a communication infrastructure.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Electric vehicles (EVs) are becoming ubiquitous and their widespread integration in the electrical distribution system has been a prime area of interest. The EVs in this disclosure relate to plug-in type EVs, which can be plugged into a 120V or 240V electric outlet, as a node in the electrical distribution system. The batteries of such EVs are charged under the control of an EV charge controller. EVs as used herein may include plug-in hybrid electric vehicles whose battery can be recharged by plugging into an external electric outlet. This disclosure does not include other types of vehicles that are not to be plugged in, such as hybrid electric vehicles that are charged by way of an onboard motor. Although most plug-in EVs are cars, plug-in EVs as used herein may include trucks, vans, buses, and motorcycles.

The downsides of largescale integration of EVs in the power grid outrival their positive aspects unless a proper charging strategy is formulated. In particular, despite the many positive aspects of EVs, such as zero tailpipe emissions, higher efficiency, and higher safety level, there are some downsides that are inherent to EVs uncontrolled charging. The simultaneous large-scale integration of EVs in the existing distribution power system significantly increases the charging load, which may lead to under voltages, higher losses, phase unbalance, load peaking, line and transformer overloads. See S. Shafiq, A. T. Al-Awami, "Reliability and economic assessment of renewable microgrid with V2G electric vehicles coordination," *IEEE Jordon. Conf. App. Elec. Eng. And Comp. Tech,* 2015, pp. 1-6, incorporated herein by reference in its entirety. This burden is already being noticed by some system operators. See S. W. Hadley and A. A. Tsvetkova, "Potential impacts of plug-in-hybrid electric vehicles on regional power generation," *Electr. J.*, vol. 22, no. 10, pp. 56-68, 2009, incorporated herein by reference in its entirety. These issues can be significantly mitigated by incorporating EV charging control strategies.

Several methods have been proposed to control EV charging. These charging control methods can be classified into three categories: centralized, decentralized, and autonomous. See S. Faddel, A. T. Al-Awami, 0. A. Mohammed, "Charge control and operation of electric vehicles in power grids: A Review," *Energies*, vol. 11, no. 4, p. 701, Mar. 2018, incorporated herein by reference in its entirety. In centralized charging strategies, EV owners submit charging requests to an EV aggregator that, utilizing central control unit, determines the optimal charging schedules by coordinating the charging patterns of the customer. EVs are utilized by aggregators to provide ancillary services to the power system by controlling the EV charging/discharging. See K. Kaur, R. Rana, N. Kumar, M. Singh and S. Mishra, "A colored petri net based frequency support scheme using fleet of electric vehicles in smart grid environment," *IEEE Transactions on Power Systems*, vol. 31, no. 6, pp. 4638-4649, Nov. 2016; J. Pillai and B. Bak-Jensen, "Integration of vehicle-to-grid in the Western Danish power system," *IEEE Trans. Sustain. Energy*, vol. 2, no. 1, pp. 12-19, Jan. 2011; M. Ansari, A. T. Al-Awami, E. Sortomme and M. A. Abido, "Coordinated bidding of ancillary services for vehicle-to-grid using fuzzy optimization," *IEEE Transactions on Smart Grid*, vol. 6, no. 1, pp. 261-270, Jan. 2015, which are incorporated herein by reference in their entirety. Charging management algorithms are presented for EVs to satisfy both the driver and power grid requirements. See Yagcitekin and M. Uzunoglu, "A double-layer smart charging strategy of electric vehicles taking routing and charge scheduling into account," Applied Energy, vol. 167, pp. 407-419, April 2016; J. Quirós-Tortós, L. F. Ochoa, S. W. Alnaser and T. Butler, "Control of EV charging points for thermal and voltage management of LV networks," *IEEE Transactions on Power Systems*, vol. 31, no. 4, pp. 3028-3039, July 2016; J. Hu, S. You, M. Lind, and J. Østergaard, "Coordinated charging of electric vehicles for congestion prevention in the distribution grid," *IEEE Trans. Smart Grid*, vol. 5, no. 2, pp. 703-711, Mar. 2014; A. D. Giorgio, F. Liberati, and S. Canale, "Electric vehicles charging control in a smart grid: A model predictive control approach," *Control Eng. Practice*, vol. 22, pp. 147-162,2014, which are incorporated herein by reference in their entirety. The EVs charging cost is minimized by controlling the charging rates in a manner that ensures EV charge requirements. See P. You, Z. Yang, M. Y. Chow and Y. Sun, "Optimal cooperative charging strategy for a smart charging station of electric vehicles," *IEEE Transactions on Power Systems*, vol. 31, no. 4, pp. 2946-2956, July 2016; S. F. Gamal, A. T. Al-Awami, and M. A. Abido, "Fuzzy optimization for the operation of electric vehicle parking lots," *Elect. Power Syst. Res.*, vol. 145, pp. 166-174, Apr. 2017, which are herein incorporated by reference in their entirety. Distribution feeder losses are minimized. See E. Sortomme, M. Hindi, S. D. J. MacPherson, and S. S. Venkata, "Coordinated charging of plug-in hybrid electric vehicles to minimize distribution system losses," *IEEE Trans. Smart Grid*, vol. 2, no. 1, pp. 198-206, Mar. 2011; M. A. S. Masoum, P. S. Moses, and S. Hajforoosh, "Distribution transformer stress in smart grid with coordinated charging of plug-in electric vehicles," in *Proc. ISGT,* 2012, pp. 1-8; Z. Peng, Q. Kejun, Z. Chengke, B. G. Stewart, and D. M. Hepburn, "A methodology for optimization of power systems demand due to electric vehicle charging load," *IEEE Trans. Power Syst.*, vol. 27, no. 3, pp. 1628-1636, Aug. 2012, which are incorporated herein by reference in their entirety. It has been observed that using centralized charging, the feeder load profile can be made flatter and voltage violations can be minimized. See E. Sortomme, M. Hindi, S. D. J. MacPherson, and S. S. Venkata, "Coordinated charging of plug-in hybrid electric vehicles to minimize distribution system losses," *IEEE Trans. Smart Grid*, vol. 2, no. 1, pp. 198-206, Mar. 2011; Z. Peng, Q. Kejun, Z. Chengke, B. G. Stewart, and D. M. Hepburn, "A methodology for optimization of power systems demand due to electric vehicle charging load," *IEEE Trans. Power Syst.*, vol. 27, no. 3, pp. 1628-1636, Aug. 2012, which are incorporated herein by reference in their entirety. Moreover, the transformer lifetime can be prolonged. See M. A. S.

Masoum et al. Note that centralized strategies require that the system and EV data be obtained and sent to a central control unit, and pre-dispatch and real-time charge schedules be sent back to the EVs. Hence, a well-developed communication infrastructure is required.

In decentralized charging control strategies, EVs are usually equipped with smart charge controllers. When an EV gets connected to a decentralized control framework, the utility or system operator sends an input, e.g. a price signal or a charging rate limit, to the smart charge controller, which performs local optimization and obtains the EV charge schedule. Sometimes, each smart charge controller oversees the charging process of a small group of EVs, such as in residential buildings or public parking lots. Charging strategies for EVs in an apartment building are investigated and compared. See J. Van Roy, N. Leemput, F. Geth, R. Salenbien, J. Bülscher and J. Driesen, "Apartment building electricity system impact of operational electric vehicle charging strategies," *IEEE Transactions on Sustainable Energy*, vol. 5, no. 1, pp. 264-272, Jan. 2014, incorporated herein by reference in its entirety. The concept of non-cooperative games is utilized. See Z. Ma, D. S. Callaway, and I. A. Hiskens, "Decentralized charging control of large populations of plug-in electric vehicles," *IEEE Trans. Control Syst. Technol.*, vol. 21, no. 1, pp. 67-78, Jan. 2013; R. Wang, G. Xiao and P. Wang, "Hybrid centralized-decentralized (HCD) charging control of electric vehicles," *IEEE Transactions on Vehicular Technology*, vol. 66, no. 8, pp. 6728-6741, Aug. 2017, which are incorporated herein by reference in their entirety. The charging schedules of a large number of PEVs, available at municipal parking station, are optimally managed using computational intelligence-based algorithms. See W. Su, M.-Y. Chow, "Computational intelligence-based energy management for a large-scale PHEV/PEV enabled municipal parking deck," *Appl. Energy*, vol. 96, pp. 171-182, August 2012 incorporated herein by reference in its entirety. The EV charging schedules are specified to ensure the valley-filling behavior. The joint optimization of optimal power flow and EV charging requirements are decomposed and solved in a nested fashion (see N. Chen, C. W. Tan and T. Q. S. Quek, "Electric vehicle charging in smart grid: Optimality and valley-filling algorithms," *IEEE Journal of Selected Topics in Signal Processing*, vol. 8, no. 6, pp. 1073-1083, Dec. 2014, incorporated herein by reference in its entirety), whereas each EV needs to solve its local optimization problem. See L. Gan, U. Topcu and S. H. Low, "Optimal decentralized protocol for electric vehicle charging," *IEEE Transactions on Power Systems*, vol. 28, no. 2, pp. 940-951, May 2013, incorporated herein by reference in its entirety. The shrunken primal-dual sub-gradient algorithm is proposed to control the EV charging process. See M. Liu, P. K. Phanivong, Y. Shi and D. S. Callaway, "Decentralized charging control of electric vehicles in residential distribution networks," *IEEE Transactions on Control Systems Technology*, pp. 1-16, 2017, incorporated herein by reference in its entirety. The mixed-integer programming approach is used to adjust the EV charging rate for a multi-family dwelling satisfying transformer overload constraints. See W. Qi, Z. Xu, Z. J. M. Shen, Z. Hu and Y. Song, "Hierarchical coordinated control of plug-in electric vehicles charging in multifamily dwellings," *IEEE Transactions on Smart Grid*, vol. 5, no. 3, pp. 1465-1474, May 2014, incorporated herein by reference in its entirety. Decentralized control strategies require reduced communication setup and lower computational resources as compared to their centralized counterparts.

In contrast to centralized and decentralized control strategies, autonomous charging control strategies do not require any kind of communication setup and require minimal computational burden. This makes them more suitable for distribution systems that lack a communication infrastructure, such as that of Saudi Arabia. In this case, a local controller is used to manage the charging rate of each EV based on local measurements at the point of charging (POC). A number of methods have been developed to autonomously control the charging rates of EVs. The system frequency and required SOC for a next trip are used to design a bidirectional EV charge controller. See Y. Ota, H. Taniguchi, J. Baba, and A. Yokoyama, "Implementation of autonomous distributed V2G to electric vehicle and DC charging system," *Electric Power Systems Research*, vol. 120, pp. 177-183, Mar. 2015, incorporated herein by reference in its entirety. An autonomous control scheme provides distributed spinning reserves while satisfying the users' requirements. All the buses in the power system always have same frequency, however, they can have different voltage profiles. So, the impact of EVs would not be mitigated unless the frequency of the system goes below a certain range. A rule based charging algorithm for plug-in hybrid electric vehicles (PHEVs) has been proposed. See H. Turker, A. Hably, S. Bacha, and D. Chatroux, "Rule based algorithm for plug-in hybrid electric vehicles (PHEVs) integration in residential electric grid areas," 2012 *IEEE PES Innovative Smart Grid Technologies* (*ISGT*), 2012, pp. 1-7, incorporated herein by reference in its entirety. The proposed algorithm uses the daily load profiles of homes to determine a minimum charging rate while ensuring the complete charging of batteries before the next use without charging during peak hours. The controller is solely based on the load profile of the home and does not consider system conditions.

Voltage-based EV charge controllers have also been presented, for example a voltage drop based EV charge controller. See N. Leemput, F. Geth, J. Van Roy, A. Delnooz, J. Büscher and J. Driesen, "Impact of electric vehicle on-board single-phase charging strategies on a Flemish residential grid," *IEEE Transactions on Smart Grid*, vol. 5, no. 4, pp. 1815-1822, July 2014; F. Geth, N. Leemput, J. Van Roy, J. Büscher, R. Ponnette, and J. Driesen, "Voltage droop charging of electric vehicles in a residential distribution feeder," in *Proc. IEEE Power Energy Soc. Innovative Smart Grid Technol. Conf. Eur.*, Berlin, Germany, 2012, pp. 1-8, which are incorporated herein by reference in their entirety). The load profile is flattened by controlling the charging rates of EVs and the impact of proposed approach is determined based on electrically driven distances and the charging time of EVs. See N. Leemput, F. Geth, J. Van Roy, A. Delnooz, J. Büscherand J. Driesen, "Impact of electric vehicle on-board single-phase charging strategies on a Flemish residential grid," *IEEE Transactions on Smart Grid*, vol. 5, no. 4, pp. 1815-1822, July 2014, incorporated herein by reference in its entirety. Local voltage and next departure time are used to determine the charging rates of EVs. Different EV load models are described. See F. Geth, N. Leemput, J. Van Roy, J. Büscher, R. Ponnette, and J. Driesen, "Voltage droop charging of electric vehicles in a residential distribution feeder," in *Proc. IEEE Power Energy Soc. Innovative Smart Grid Technol. Conf. Eur.*, Berlin, Germany, 2012, pp. 1-8, incorporated herein by reference in its entirety. These load models are simulated on the residential grid in Belgium, and their performance are compared on the basis of minimum charging rate achieved, system losses, and system voltage level. Although these charging techniques do not require any communication infrastructure, the issue of fairness among EVs at upstream and downstream nodes is not addressed.

A local load charging method has been proposed to optimize the performance of EV charge controller. See P. Richardson, D. Flynn, and A. Keane, “Local versus centralized charging strategies for electric vehicles in low voltage distribution systems,” *IEEE Trans. Smart Grid*, vol. 3, no. 2, pp. 1020-1028, Jun. 2012, incorporated herein by reference in its entirety. In addition to the nodal voltage, a pre-defined voltage sensitivity to load change at the POC is used to determine the charging rate. However, since the system is continuously subjected to different loading conditions and possible reconfigurations, the sensitivity does not remain the same over a given period of time. Hence, using the sensitivities, which are pre-determined offline may lead to unfair EV charging. A nodal voltage is compared with the pre-set reference voltage to determine the charging rates of EVs. An autonomous voltage feedback EV controller is presented which compares the voltage at POC with the common reference voltage. See A. T. Al-Awami and E. Sortomme, “Electric vehicle charging modulation using voltage feedback control,” in 2013 *IEEE Power & Energy Society General Meeting,* 2013, incorporated herein by reference in its entirety. The charging rate of EV decreases as the nodal voltage approaches reference set point. The upstream nodes have unintended higher charging rates since they have good voltage profiles as compared to downstream nodes. An instantaneous voltage at POC and SOC of EV battery are used to control the charging rates. See G. M. A. Akhtar, A. T. Al-Awami, E. Sortomme, M. A. Abido and M. W. Ahmed, “Autonomous electric vehicle charging management over real time digital simulator,” 2014 *IEEE PES General Meeting|Conference & Exposition*, National Harbor, Md., 2014, pp. 1-5, incorporated herein by reference in its entirety. Different reference voltages have been specified for different system nodes which may lead to unfair charging among EVs present at different locations in the distribution system since the system may change its configuration. Furthermore, variations in the system loading may affect the fairness property. A real time digital simulator is used to implement the controller. See S. Faddel, A. T. Al-Awami and M. A. Abido, “Real time digital simulation of voltage-based controller for electric vehicle charging,” 2016 *Clemson University Power Systems Conference* (*PSC*), Clemson, S.C., 2016, pp. 1-5, incorporated herein by reference in its entirety. The controller adjusts the charging rates to avoid voltage violations while ensuring fairness among EVs. However, most of the system nodes are modelled as balanced which does not hold true for a secondary distribution system. A nonlinear voltage-based controller determines the charging rate based on the local voltage and battery SOC while satisfying the end-of-charge time (ECT) requirements set by the EV owner. See A. T. Al-Awami, E. Sortomme, G. M. A. Akhtar and S. Faddel, “A voltage-based controller for an electric-vehicle charger,” *IEEE Transactions on Vehicular Technology*, vol. 65, no. 6, pp. 4185-4196, June 2016, incorporated herein by reference in its entirety. Although the nonlinear function addresses the fairness issue among the EVs, the control strategy is very conservative. For example, the simulation results indicate that at light loading conditions, this strategy tends to constrain the EV charging rates unnecessarily.

It is one object of the present disclosure to describe an autonomous EV charge control strategy that ensures fair charging among the EVs throughout a distribution grid but avoids unnecessarily conservative charge control. Other objectives include ensuring robustness to changes in loading conditions and system configurations. In some aspects, the state of charge of the EV battery and driver’s end-of-charge time preference are accommodated.

SUMMARY

In an exemplary embodiment, a charge controller for controlling a charging rate for at least one battery of an electric vehicle is disclosed. The at least one battery receives charge via a node connected to a power distribution source. The charge controller including circuitry configured to at each time step, receive a nodal voltage measurement for voltage at the node, receive an electric power measurement for power at the node, determine a change in the electric power measurement based on a previous time step, when the change in electric power is greater than a power change threshold, determine an estimate of voltage-to-load sensitivity, determine the charging rate of the electric vehicle based on the nodal voltage, the determined voltage-to-load sensitivity, and a state of charge of the at least one battery, and control the charging rate for the at least one battery in accordance with the determined charging rate.

In another exemplary embodiment, a charge control method controls a charging rate for at least one battery of an electric vehicle, the at least one battery receiving charge via a node connected to a power distribution source. The method includes at each time step, receiving a nodal voltage measurement for voltage at the node; receiving an electric power measurement for power at the node; determining a change in the electric power measurement based on a previous time step; when the change in electric power is greater than a power change threshold, determining an estimate of voltage-to-load sensitivity; determining the charging rate of the electric vehicle based on the nodal voltage, the determined voltage-to-load sensitivity, and a state of charge of the at least one battery; and controlling the charging rate for the at least one battery in accordance with the determined charging rate.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings.

DETAILED DESCRIPTION

Figure 1:
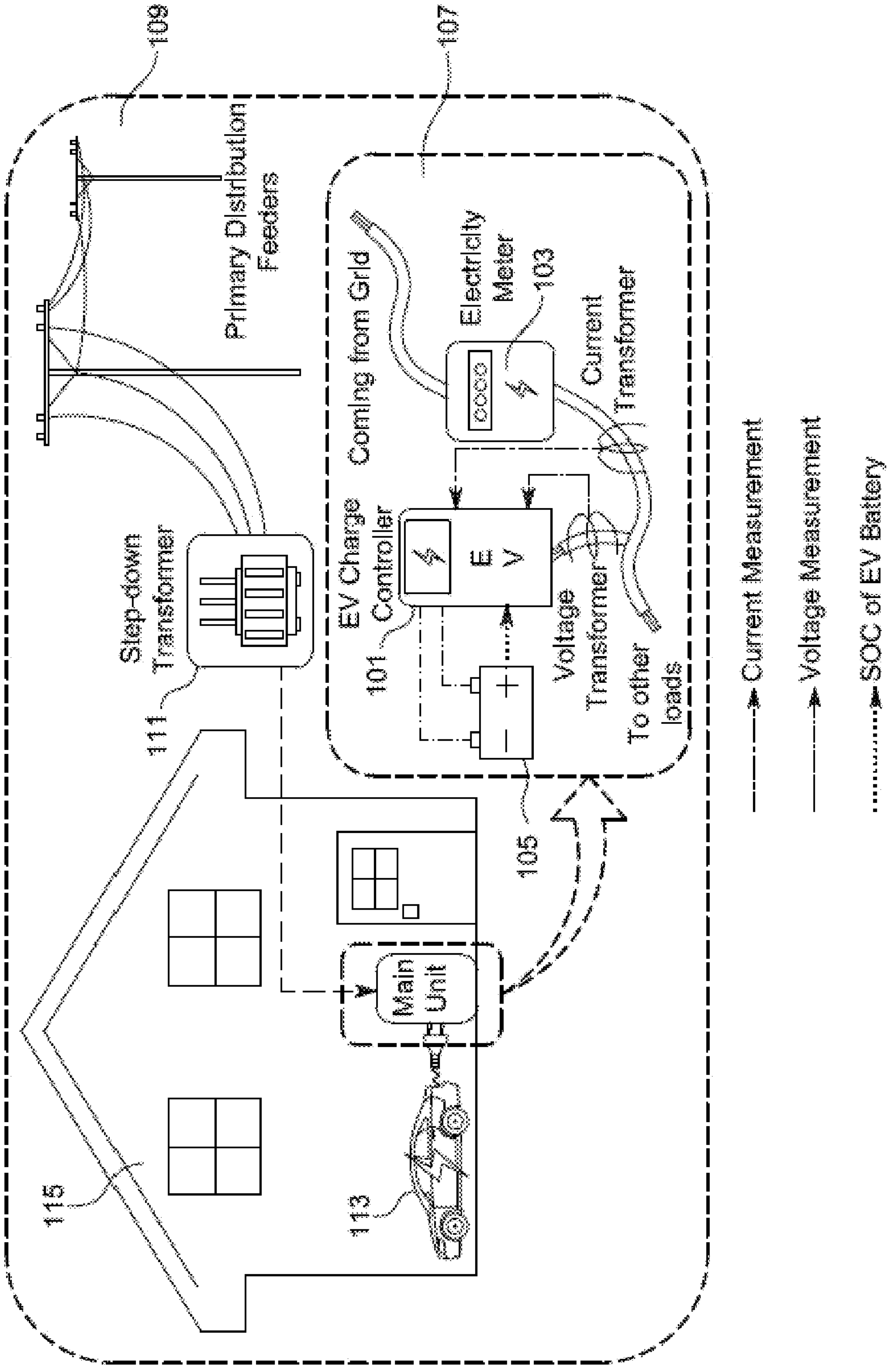
FIG. 1 is a diagram of an electric vehicle charge control system in accordance with an exemplary aspect of the disclosure.

In the drawings, like reference numerals designate identical or corresponding parts throughout the several views. As used herein any reference to "one embodiment" or "some embodiments" or "an embodiment" means that a particular element, feature, structure, or characteristic described in connection with the embodiment is included in at least one embodiment. The appearances of the phrase "in one embodiment" in various places in the specification are not necessarily all referring to the same embodiment. Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. In addition, the articles "a" and "an" as used in this application and the appended claims are to be construed to mean "at least one" unless specified otherwise.

Furthermore, the terms "approximately," "proximate," "minor," and similar terms generally refer to ranges that include the identified value within a margin of 20%, 10% or preferably 5% in certain embodiments, and any values therebetween.

Aspects of this disclosure are directed to an autonomous voltage- and sensitivity-based EV charge control strategy. As with most autonomous control strategies, this strategy utilizes a local controller to manage the charging rate of each EV based on local measurements at the point of charging. This strategy ensures fair charging among the EVs throughout the distribution grid. The complimentary relationship between the voltage at POC and its sensitivity to load change is employed to avoid any unnecessary conservative behavior, such as that of the control strategy presented in A. T. Al-Awami, et al. (2016).

The autonomous charge control strategy includes estimating the voltage sensitivities online (i.e. in real-time). The voltage sensitivities are estimated without communication to or from other nodes in the power distribution grid, i.e., are estimated communication-free and thus, the local charge controller operates autonomously and does not require dedicated communication hardware and ensures the robustness of the control strategy to changes in loading conditions and system configurations. The SOC of EV battery and owner's ECT preference are also considered.

Voltage Sensitivity Estimation

Jacobian Matrix-Based Approach

The voltage sensitivities can be obtained using the inverse Jacobian matrix obtained from power flow analysis. See G. Valverde and T. V. Cutsem, "Model predictive control of voltages in active distribution networks," *IEEE Transactions on Smart Grid*, vol. 4, no. 4, pp. 2152-2161, Dec. 2013; Q. Zhou and J. Bialek, "Simplified calculation of voltage and loss sensitivity factors in distribution networks," in *Proc. 16th Power Syst. Compute. Conf.* (*PSCC*), Glasgow, U.K., 2008, which are incorporated herein by reference in their entirety. The change in voltage due to change in real and reactive powers at the bus of interest, at a given operating point, can be determined using (1). θ and V are bus voltage angles and magnitudes vectors, respectively. The voltage sensitivities of the buses need to be updated whenever the system conditions change. For instance, if the system loading or network topology changes, the sensitivities are preferably re-calculated. Therefore, to implement this approach, the system should be fully observable, i.e. remote monitoring must exist. Currently, no such capability exists in many distribution systems. Also, since the sensitivity updates must be obtained centrally, this method is not suitable for autonomous control strategies.

$$J^{-1} = \begin{bmatrix} \frac{\partial \theta}{\partial P} & \frac{\partial \theta}{\partial Q} \\ \frac{\partial V}{\partial P} & \frac{\partial V}{\partial Q} \end{bmatrix} \tag{1}$$

$$\Delta V = \frac{\partial V}{\partial P}\Delta P + \frac{\partial V}{\partial Q}\Delta Q \tag{2}$$

Perturb-And-Observe Power Flow Based Approach

In this approach, a power flow is run for the current state of system and voltages are obtained. The active (or reactive) power, at the bus of interest, is changed by a certain amount and the power flow is re-run to find the new voltages. Based on the two power flow results, the voltage sensitivities are calculated. See T. Sansawatt, L. F. Ochoa, and G. P. Harrison, "Smart decentralized control of DG for voltage and thermal constraint management," *IEEE Trans. Power Syst.*, vol. 27, no. 3, pp. 1637-1645, Aug. 2012, incorporated herein by reference in its entirety. The loads are added incrementally and a series of power flow analyses are performed to calculate the sensitivities at all buses. See P. Richardson, D. Flynn and A. Keane, "Optimal charging of electric vehicles in low-voltage distribution systems," *IEEE Transactions on Power Systems*, vol. 27, no. 1, pp. 268-279, Feb. 2012; X. Luo and K. W. Chan, "Real-time scheduling of electric vehicles charging in low-voltage residential distribution systems to minimise power losses and improve voltage profile," *IET Generation, Transmission & Distribution*, vol. 8, no. 3, pp. 516-529, March 2014, which are incorporated herein by reference in their entirety. Like the Jacobian approach, the sensitivities must be updated every time the network states are changed and a full network observability is needed. Hence, this method is not suitable for autonomous control strategies.

Fitting Function Based Approach

To eliminate the need of communication infrastructure, many demand/generation scenarios are generated based on planning data and extensive simulations are performed to identify the non-linear relationship of sensitivities. See Z. Zhang, L. F. Ochoa and G. Valverde, "A novel voltage sensitivity approach for the decentralized control of DG plants," *IEEE Transactions on Power Systems*, vol. 33, no. 2, pp. 1566-1576, March 2018, incorporated herein by reference in its entirety). To do so, a network topology, conductor parameters, rated capacities of system components, types of loads and generations are must be known in advance. Furthermore, thousands of load/generation scenarios are needed to model the temporal relationship between sensitivities and system conditions. Then, a surface fitting function is used to determine the sensitivity relationships for all the system nodes. Although this approach does not require remote monitoring, large computational resources are required. Moreover, the accuracy of these functions depends on the number of scenarios considered. Similarly, these functions become inapplicable when the system configuration changes, which makes it unsuitable for autonomous control strategies.

Quasi-Offline Parameter Measurement Based Sensitivity Approach

In this approach, some sensitivity parameters are determined offline while the actual sensitivity is calculated in a real-time analysis. A constant conductance and susceptance of an equivalent path between the DG and the transformer are used to find the coefficients of reactive power voltage magnitude and angle sensitivity functions. See C. Murphy and A. Keane, "Optimised voltage control for distributed generation," *PowerTech,* 2015 *IEEE Eindhoven*, Jul. 2015, incorporated herein by reference in its entirety. However, the addition of load point and/or inclusion of DG unit along that path would effectively alter the parameters of equivalent path. Sensitivity coefficients are obtained offline from historical data assuming that smart meters are installed which measure voltage as well as active and reactive power demands at each customer point. See S. Weckx, R. D"Hulst, J. Driesen, "Voltage sensitivity analysis of a laboratory distribution grid with incomplete data," *IEEE Trans. Smart Grid*, vol. 6, no. 3, pp. 1271-1280, Apr. 2015, incorporated herein by reference in its entirety. Linear model is then used to evaluate the voltages at customer nodes. This approach, however, requires updating the sensitivity coefficients when the network topology changes or a large load variation occurs. Hence, it is not suitable for autonomous control strategies, either.

Voltage- and Sensitivity-Based EV Charge Control Structure

Many models of Electric Vehicles (EVs) are available for drivers from automobile manufacturers, and the number of manufacturers and models are ever increasing. Most electric vehicles are equipped with rechargeable lithium-ion batteries. The rechargeable batteries are characterized by battery capacity and maximum charging rate. Typical EVs use one or more electric motors to drive the vehicle. As an example, a Nissan Leaf may be equipped with an electric motor that ranges from 110 KW AC to 160 KW AC. A Nissan Leaf may be equipped with a battery having a capacity of 24 KWh, 30 KWh, 40 KWh or 62 KWh. A Tesla Roadster's battery may have a capacity of 54 kWh. A rechargeable battery may be charged by plugging it in with a 240V cord into a 240V outlet. In some cases, the rechargeable battery may be charged with a connection to a standard 120V outlet. Also, a Lithium-ion battery has a maximum charging rate, which is the maximum amount of current that it can be charged with. for example, a Nissan Leaf battery may have a maximum charging rate of 6.6 KW.

The autonomous communication-free EV charge control structure and method of the present disclosure utilizes an online voltage sensitivity that does not require dedicated communications hardware for performing communication with other nodes in a power distribution grid. A possible EV charge control structure having an EV charge controller is shown in FIG. 1. Regarding the structure of FIG. 1, the charge controller 101 may be installed near the electricity meter 103 of a house 115. The EV charge controller 101 is configured to receive measurements for the total power consumption and voltage of the house 115. The EV charge controller 101 is configured to control the charging rate of at least one battery 105 of at least one electric vehicle 113 without communication through any communication infrastructure. The EV charge control structure 107 has its power provided over a primary distribution power grid 109, through a step-down transformer 111.

An object of the EV charge controller 101 is to throttle the charging rate of at least one EV based on the voltage at the POC to prevent voltage violations in the system. This can also lead to reduced line losses and avoid overloads. In addition, the EV charge controller 101 uses an EV charging strategy to ensure fairness. Fairness is achieved by a limited system capacity that is equally shared among all the EVs in the distribution system 109. In other words, fairness is achieved by charging EVs with approximately the same SOC at approximately the same rate irrespective of the locations of EVs being charged in the system.

The embodiment utilizes a charge control scheme that is based on a complementary relationship between the voltage and voltage sensitivity at the POC. The inventors have determined that nodes that have lower voltages are generally more sensitive to load power changes than those having higher voltages. According to the charge control scheme, EVs at downstream nodes will have lower voltage but higher sensitivity than those at upstream nodes. The scheme ensures fairness among the EVs at upstream, midstream, and downstream nodes.

EV Charge Controller

Figure 2:
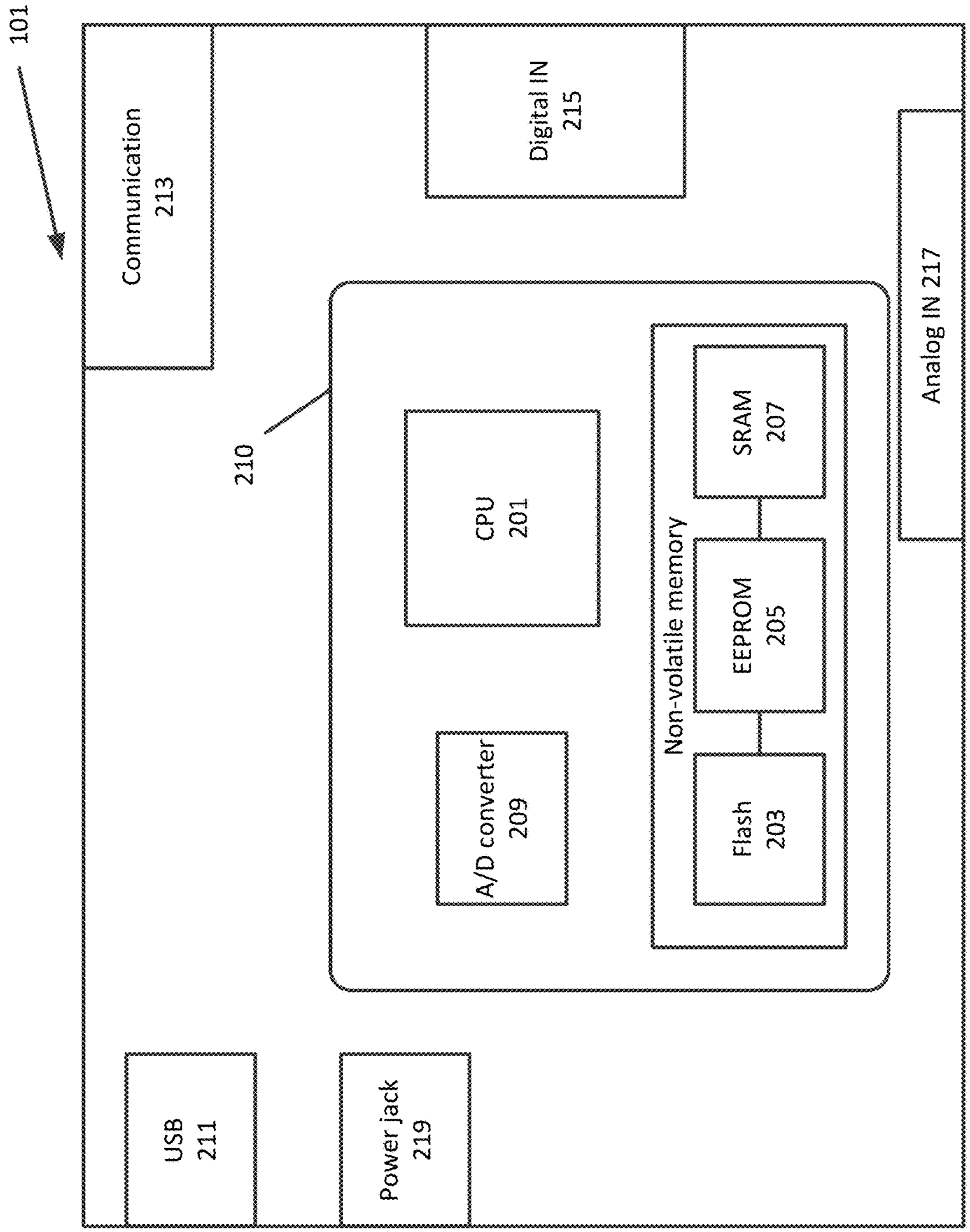
FIG. 2 is a block diagram of an EV charge controller in accordance with an exemplary aspect of the disclosure.

FIG. 2 is a block diagram of an EV charge controller in accordance with an exemplary aspect of the disclosure. The EV charge controller 101 may be based on a microcontroller. A microcontroller may contain processing circuitry including one or more processor cores (CPUs) along with memory (volatile and non-volatile) and programmable input/output peripherals. Program memory in the form of flash, ROM, EPROM, or EEPROM is often included on chip, as well as a secondary RAM for data storage. The processing circuitry may execute a computer program stored in the program memory to perform the method of controlling a charging rate of an electric vehicle as disclosed herein. The computer program may include program code in a programming language such as Fortran or C, or variants thereof, or in a mathematical computing environment such as Matlab or Mathematica, or a scripting language such as Python.

In one embodiment, the EV charge controller 101 is an integrated circuit board 101 with a microcontroller 210. The board may include digital I/O pins 215, analog inputs 217, hardware serial ports 213, a USB connection 211, and a power jack 219. Although the controller shown in FIG. 2 is a typical microcontroller-based board, it should be understood that other microcontroller configurations are possible. Variations can include the number of pins, whether or not the board includes communication ports or a reset button.

The microcontroller 210 may be a RISC-based microcontroller having flash memory 203, SRAM 207, EEPROM 205, general purpose I/O lines, general purpose registers, a real time counter, flexible timer/counters, a A/D converter 209, and a JTAG interface for on-chip debugging. The microcontroller may be a single System On Chip. Although the description is of a typical microcontroller, the present controller 101 is not limited to such. It should be understood that other microcontroller configurations may be used. For example, microcontrollers vary based on the number of processing cores, size of non-volatile memory, the size of data memory, as well as whether or not it includes an A/D converter or D/A converter.

Online Estimation Based Approach

In an Embodiment, the EV charge controller 101 estimates voltage-to-load sensitivity without communication through a communication infrastructure. The EV charge controller 101 does not require full network observability or any kind of remote monitoring. Furthermore, the EV charge controller 101 updates sensitivity in real-time, which makes it robust to changes in system topology and loading conditions. The local voltage and load power at the bus coming out of the electricity meter 103 are measured and stored in non-volatile memory of the EV controller 101 for the current system state. When the system load changes at the same bus, the new voltage and load power are also measured. The local voltage may be obtained from a voltage sensor. The load power may be measured based on current sensed by a current sensor.

The sensitivity is estimated based on the local voltage using (3). Here, $v_i$, $p_i$, and $\mu_i$ are the local voltage, total load power, and sensitivity of the $i^{th}$ node, respectively. The $i^{th}$ node as used herein is defined as a house's point of connection to the distribution system. The local voltage and total load power are measured in real-time. Hence, the sensitivity $\mu_i$ is defined herein as being updated online.

$$\mu_i(t) = \frac{\Delta v_i(t)}{\Delta p_i(t)} = \frac{v_i(t+\Delta t) - v_i(t)}{p_i(t+\Delta t) - p_i(t)} \tag{3}$$

Figure 3:
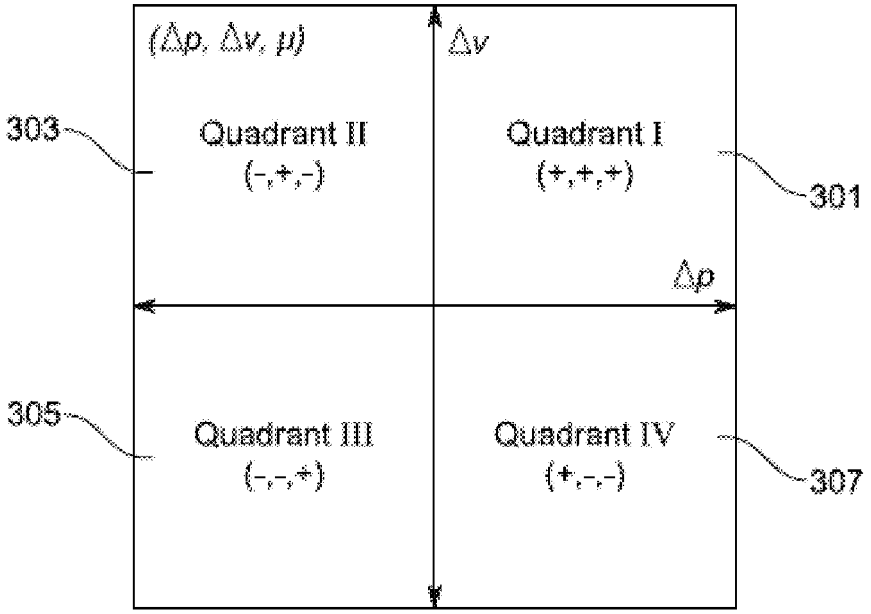
FIG. 3 is a chart of sensitivity estimation scenarios in accordance with an exemplary aspect of the disclosure.

FIG. 3 shows the four different scenarios that may arise regarding the relationship between $\Delta v_i$ and $\Delta p_i$ at node i.

Scenario 1: The load decreases and the voltage is observed to rise. Hence, the voltage sensitivity, as obtained by applying (3), is negative. This is represented by Quadrant II, 303.

Scenario 2: The load increases and the voltage is observed to drop. Thus, the voltage sensitivity is negative. This is represented by Quadrant IV, 307.

Scenario 3: The load increases but the voltage is observed to rise. Thus, the voltage sensitivity is positive. This is represented by Quadrant I, 301.

Scenario 4: The load decreases but the voltage is observed to drop. Thus, the voltage sensitivity is positive. This is represented by Quadrant III, 305.

Since the vast majority of loads are either inductive or purely resistive, the voltage should rise due to a drop in the load at the point of interest (i.e. scenario 1). Hence, the sensitivity should theoretically be negative. However, in practice, during a load drop at the point of interest, the local voltage may be observed to drop (i.e. scenario 4). The voltage drop, in this case, must have resulted from a larger load increase somewhere else in the system that occurs simultaneously with the load drop at the point of interest. A similar argument can be stated regarding scenarios 2 and 3 during load increases at the point of interest.

Although scenarios 3 and 4, which result in positive sensitivities, are possible, they are expected to occur only occasionally; i.e. only when multiple significant variations in loads occur at different buses exactly at the same time. This assumption is helped by the fact that the voltage at the bus of interest is far more sensitive to the change in load at that bus than to load changes (of comparable magnitudes) at other buses. See X. Luo and K. W. Chan, "Real-time scheduling of electric vehicles charging in low-voltage residential distribution systems to minimise power losses and improve voltage profile," *IET Generation, Transmission & Distribution*, vol. 8, no. 3, pp. 516-529, March 2014, incorporated herein by reference in its entirety.

Online Estimation Based Approach

Figure 4:
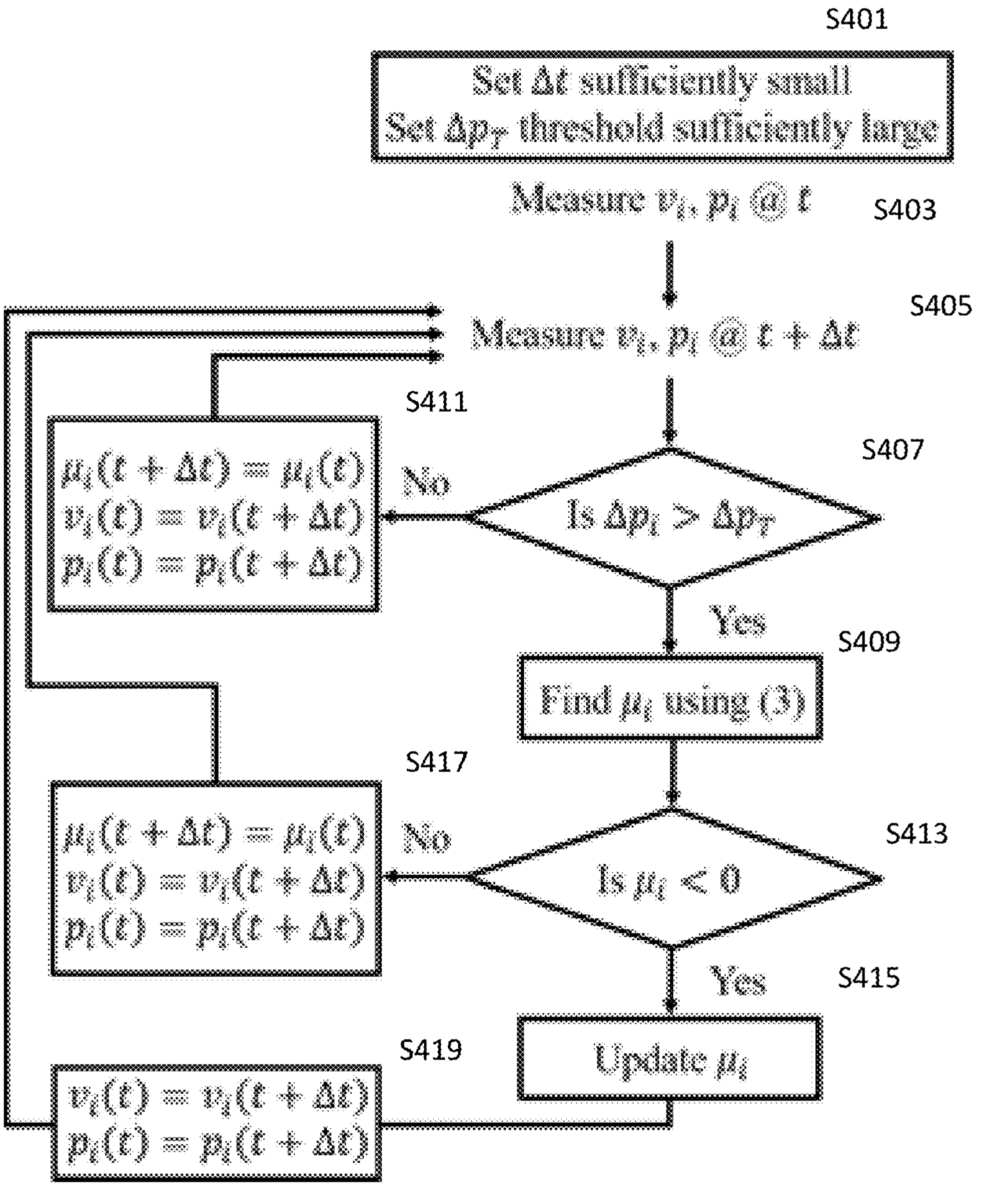
FIG. 4 is a flowchart for a method of sensitivity estimation in accordance with an exemplary aspect of the disclosure.

FIG. 4 shows a flowchart of the online sensitivity estimation procedure performed by the EV charge controller. Note that for the procedure to work properly, sufficiently large step changes in load at the point of interest should occur frequently. Large changes in load are typical for residential and commercial loads since many appliances are cyclic. That is, every time an air conditioning unit or a refrigerator changes its on/off status, there is a large change in load. In some embodiments a sensitivity update is triggered when there is a large change in load above a threshold load amount. Thus, in some embodiments, a large step change in load may be several hundred Watts, such as 500 Watts to 1000 Watts. The frequency of occurrence of such large step change in load of a typical household may be more than once an hour due to the multiple cyclic appliances such as refrigerators, furnace, A/C units, that a typical household has.

To reduce the probability of occurrence of positive sensitivity scenarios, the following two measures are taken in S401:

The EV controller 101 calculates sensitivity at the bus of interest only when the change in load at that bus is sufficiently large; i.e. larger than a load change threshold $\Delta p_T$ (YES in S407). In general, the load change threshold is determined before the EV controller is installed. In some embodiments, the load change threshold is approximately 10% of a household load before the load change occurs. For example, if the initial load is 5 kW, and it has experienced a sudden change to 5.7 kW (due to, turning on a 700 W cyclic load), then the sensitivity is updated.

The time step size, At, is set to be sufficiently small. The time step size is the time needed for the voltage to settle after a sudden change in load has occurred. In general, the time step size may be predetermined before the EV controller is installed. In some embodiments, the time step size is approximately 10 seconds.

In S403, the local voltage and load power at the bus of interest are measured and stored for the current system state. In S411, when the system load changes at the same bus, in S405, the new voltage and load power are also measured. Then, in S409 the sensitivity is estimated using (3). Here, $v_i$, $p_i$, and $\mu_i$ are the voltage, total load power, and sensitivity of the $i^{th}$ node, respectively. A node here is defined as the house's point of connection to the distribution system. Note that the voltage and total load power are to be measured in real-time, hence, in S415, the sensitivity is updated online as in S419.

$$\mu_i(t) = \frac{\Delta v_i(t)}{\Delta p_i(t)} = \frac{v_i(t+\Delta t) - v_i(t)}{p_i(t+\Delta t) - p_i(t)} \tag{3}$$

However, if in S413 the sensitivity is found positive (NO in S413), it is considered an outlier. Thus, it is neglected and, in S417, the latest negative sensitivity estimation is retained.

Figure 5:
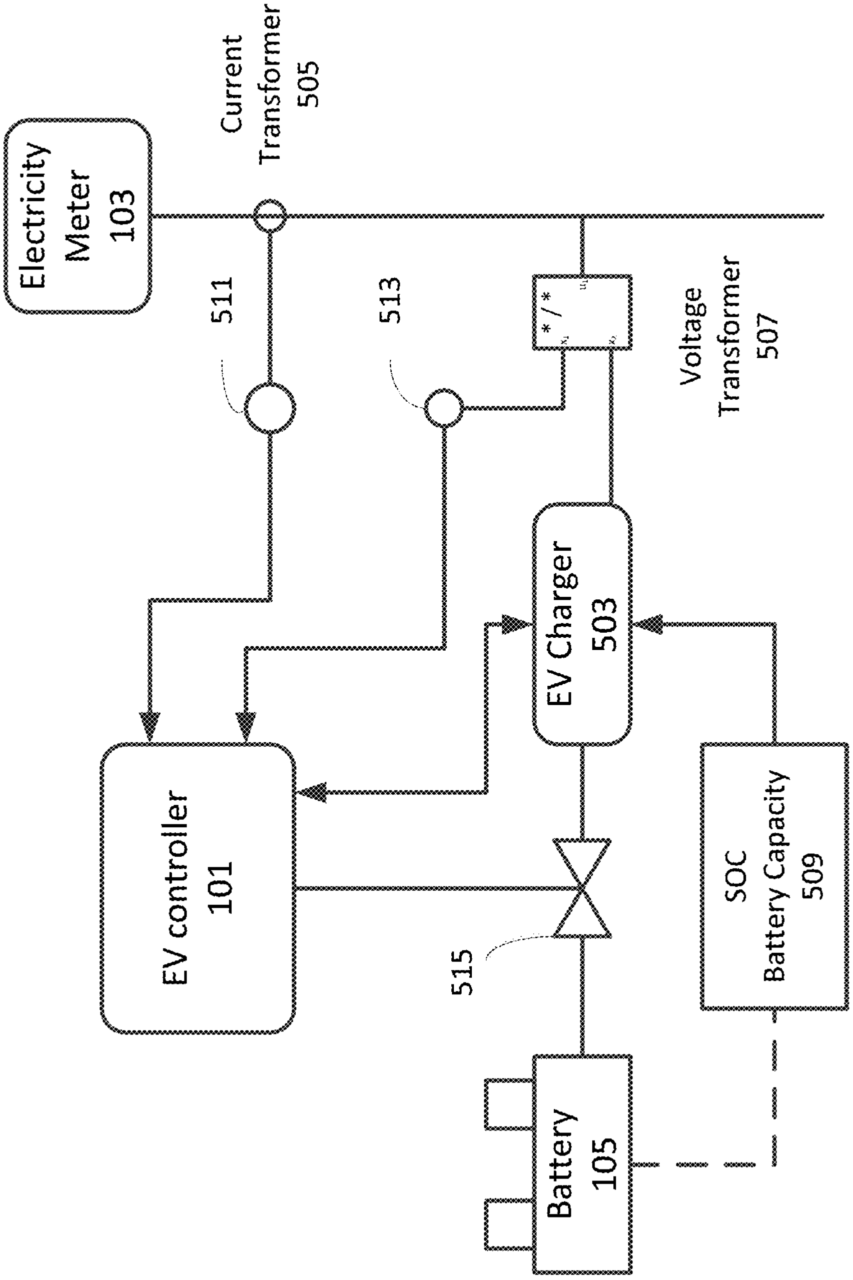
FIG. 5 is a block diagram of an EV charge control system in accordance with an exemplary aspect of the disclosure.

The online sensitivity estimation is used by the EV charge controller 101 to determine an expected charging rate of the at least one EV. The expected charging rate is continuously updated. The expected charging rate is a function of the voltage, sensitivity, and battery SOC. The sensitivity is updated frequently, but not as often as the charging rate. In particular, the voltage and SOC are updated continuously (measured in real-time). Hence, the expected charging rate is also updated continuously FIG. 5 is a block diagram of an EV charge control system in accordance with an exemplary aspect of the disclosure. An EV charger 503 converts the AC current from the power grid into a constant DC current in order to charge the EV battery 105. When connected to the grid through an SAE J1772 charging station, a pilot signal is supplied to the EV from the station that tells what the maximum AC current draw is from that connection point. The EV charges at that current unless a battery management system reduces the maximum current draw to improve battery life near the end of the charging cycle, or if the EV charger 503 cannot handle that high current level. The charging current can be varied either by varying the pilot signal at the charging station or at the EV itself. The EV charge controller 101 adjusts this EV charging current, and therefore the charging load, based on the AC voltage observed at the point of connection.

In order for the charging current to be nonzero, the EV must be plugged in, the voltage at the charging point (POC) must be within permissible limits, and the battery state of charge (SOC) must be still below the maximum battery capacity. An on/off switch 515, in which on indicates that the EV is plugged in to the charger 503, off being that the EV is not plugged in to the charger 503, may be provided between the EV battery 105 and the EV charger 503. A current transformer 505 may include a current measurement device 511 for measuring power and providing a power measurement to the EV charge controller 101. A voltage transformer 507 may include a voltage measurement device 13 for measuring nodal voltage and providing the voltage measurement to the EV charge controller 101. The output of the voltage transformer 507 also provides the power to the EV charger 503.

Figure 6:
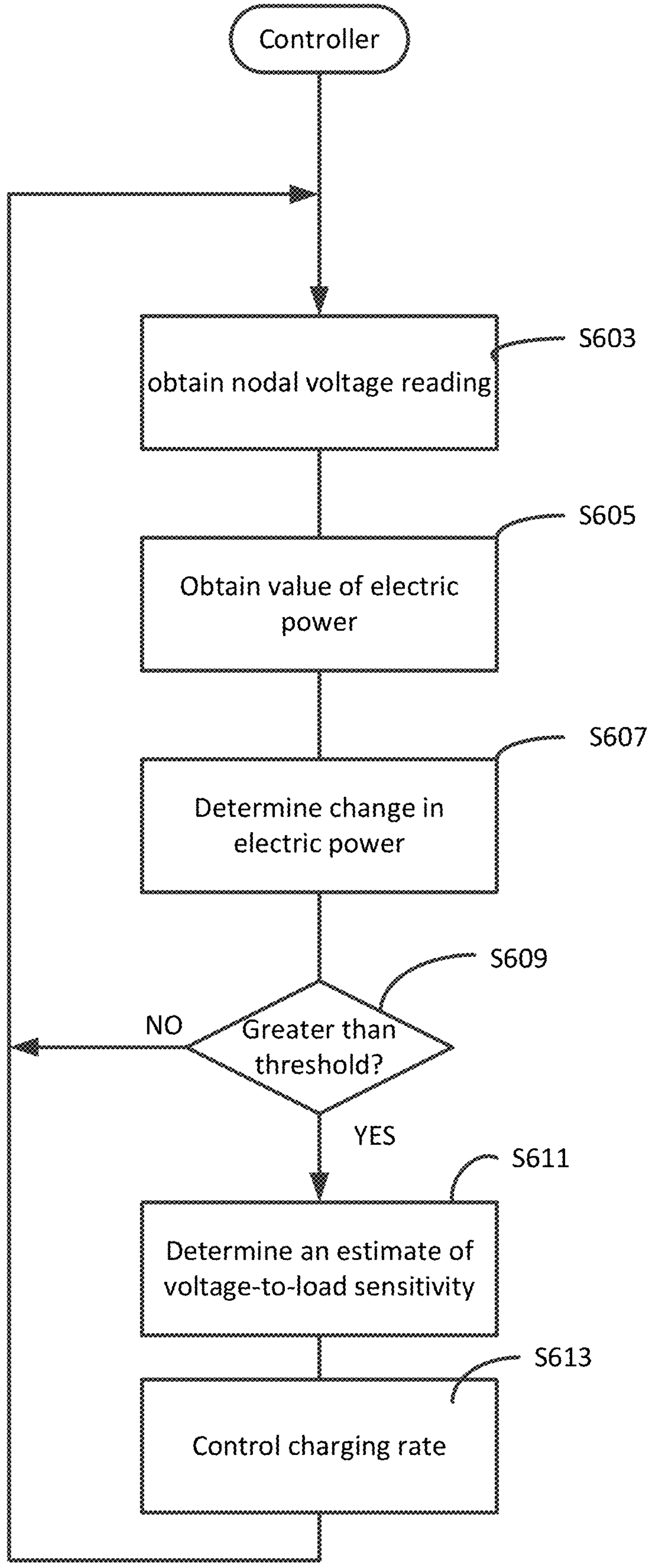
FIG. 6 is a flowchart for a method of controlling a charging rate of an electric vehicle in accordance with an exemplary aspect of the disclosure.

FIG. 6 is a flowchart for a method of controlling a charging rate of an electric vehicle in accordance with an exemplary aspect of the disclosure. In S603 the EV charge controller 101 receives a nodal voltage measurement for voltage at the point of charge, and in S605 receives an electric power measurement for power at the node. In S607, the EV charge controller 101 determines a change in the electric power measurement based on a previous time step. In S609 YES, each time the change in electric power is greater than a load change threshold, in S611 the EV charge controller 101 determines an estimate of voltage-to-load sensitivity. In S613, the EV charge controller determines the charging rate of the electric vehicle based on the nodal voltage, the determined voltage-to-load sensitivity, and a state of charge of the at least one battery, and controls the charging rate for the at least one battery in accordance with the determined charging rate.

Typically the charging deadlines for EVs would be specified based on regular departure times since the EVs are being charged at home. However, sometimes the EVs may need to be used before the specified charging deadline. Therefore, it is preferable to charge the EVs having lower SOC faster. In some embodiments, EVs having low SOC, below a SOC threshold, are charged faster by applying an exponential function for SOC. The voltage-to-load sensitivity is determined as in FIG. 4. The EV charge controller 101 receives the measured nodal voltage, the determined voltage-to-load sensitivity, and battery SOC as input signals and calculates an expected charging rate for an EV.

In one embodiment, the expected charging rate of an the $j^{th}$ EV, $EP_j$, is determined by (4), where $\alpha_j$ is the minimum charging rate, $v_r$ is the reference voltage, $\lambda_j$ is the per unit SOC of the EV, and $\beta_j$ is a controller parameter. To ensure that the actual charging rate, $P_j$, does not exceed the charger rating, $\overline{P_j}$, relation (5) is used. According to IEC 61851 standard, the minimum charging current limit is 6 A. See IEC TC69, "IS 61851-1:2010 Ed. 2.0," *IEC Standard,* 2010, incorporated herein by reference in its entirety. Therefore, a minimum charging rate, $\alpha_j$, which is based on the minimum current limit is included in (4). Subsequently, the only parameter to be tuned is $\beta_j$, resulting in a simple control operation.

In some embodiments, the EV charge controller 101 may further include ECT preferences since some EV drivers may need to use the EV earlier. The charging rate is dependent on the uncharged battery capacity and expected departure time. In order for the EV charge controller 101 to determine charging rate with a constraint of an ECT preference, the charging rate is determined by (6), where $B_{c_j}$ is the battery capacity, $SOC_j$ is the actual state-of-charge, and $d_j$ is the preferred departure time of the $j^{th}$ EV, respectively. This modified EV charge control structure may guarantee that the preferred departure time is met whenever possible, i.e. as long as ECT is reasonable to get the EV fully charged.

$$EP_j(t) = \begin{cases} \alpha_j + \{\beta_j \cdot e^{-(\mu_i(t))(v_i(t)-v_r)}\} \cdot e^{(1-\lambda_j)}, & v_i(t) \geq v_r \\ 0, & \text{else} \end{cases} \tag{4}$$

$$P_j(t) = \begin{cases} EP_j(t), & EP_j(t) < \overline{P_j} \\ \overline{P_j}(t), & EP_j(t) \geq \overline{P_j} \end{cases} \tag{5}$$

$$\hat{P}_j(t) = \max\left(\frac{B_{c_j} - SOC_j}{t - d_j},\ P_j(t)\right) \tag{6}$$

EXAMPLE

Figure 7:
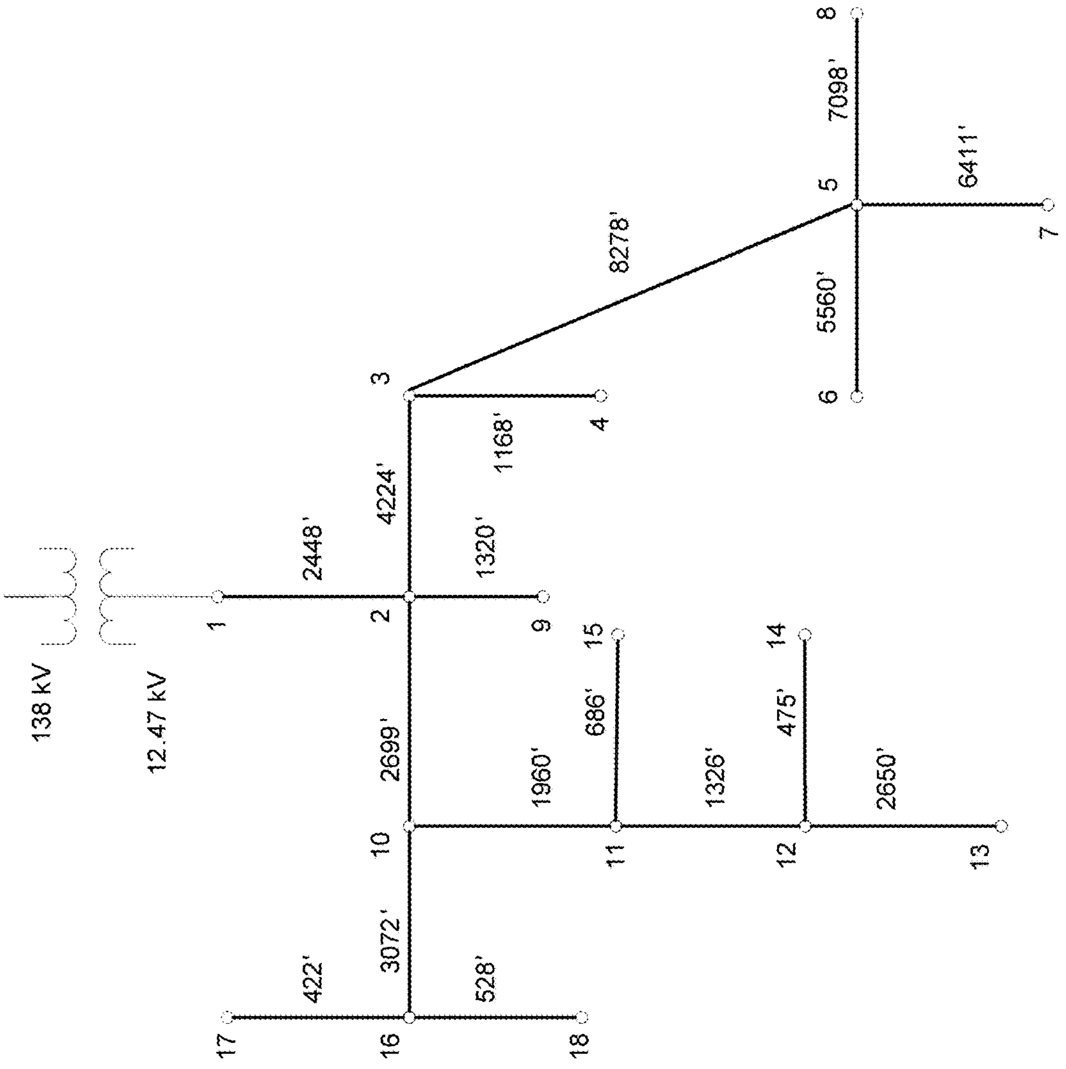
FIG. 7 is a diagram of a test distribution system.
Figure 8:
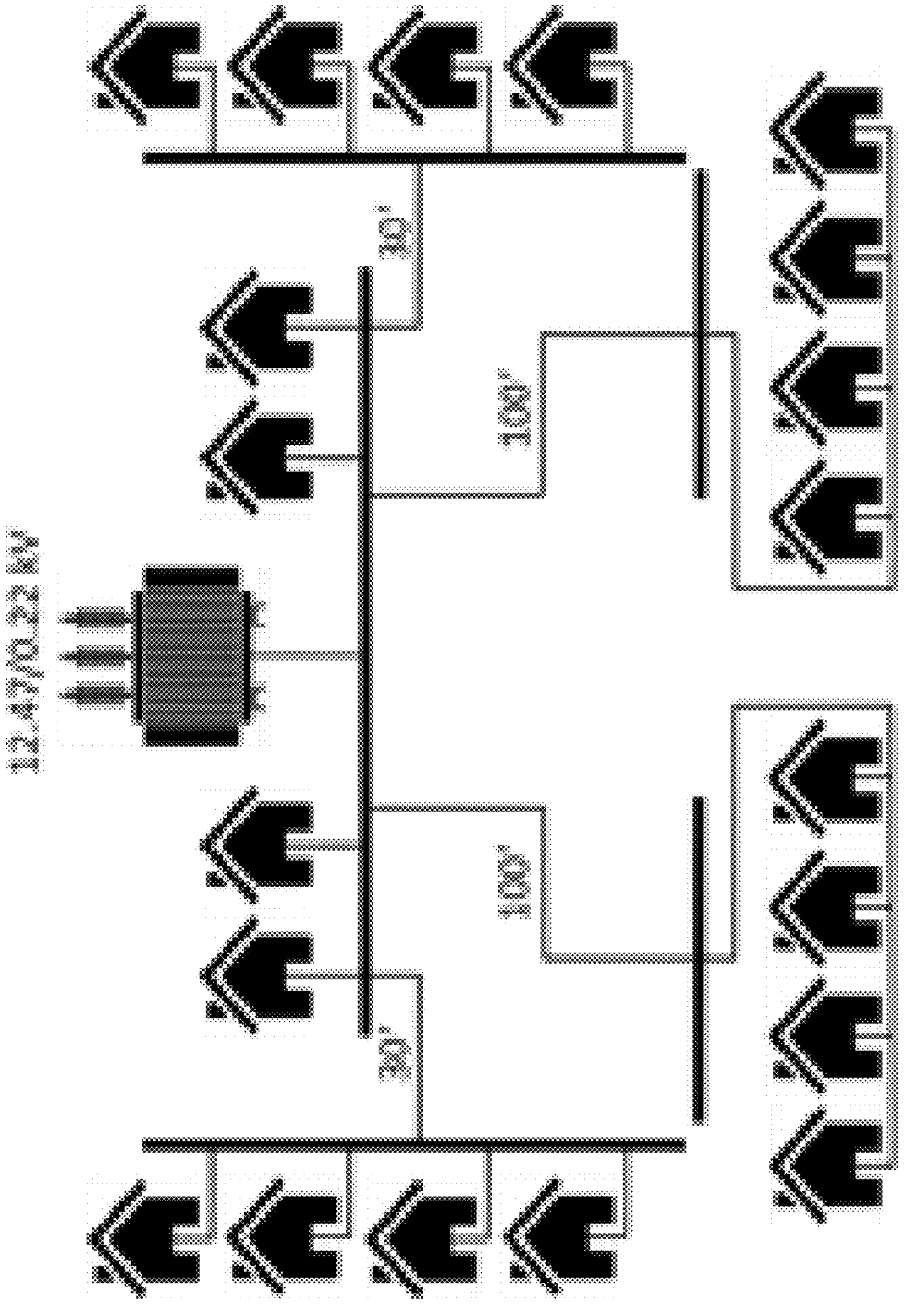
FIG. 8 is a diagram of a distribution network topology.
Figure 9A:
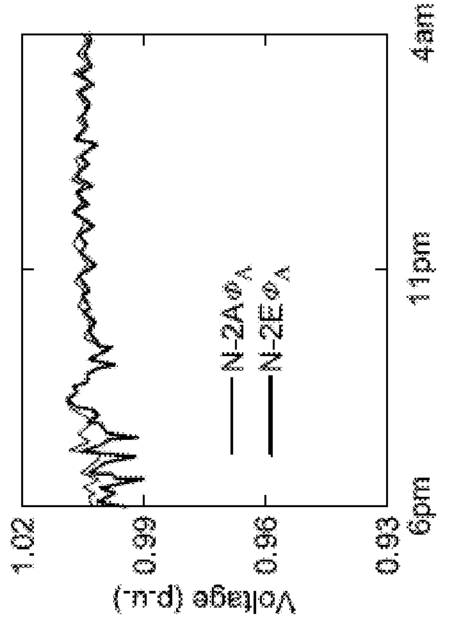
FIGS. 9A, 9B, 9C, 9D are graphs of node voltages.
Figure 9B:
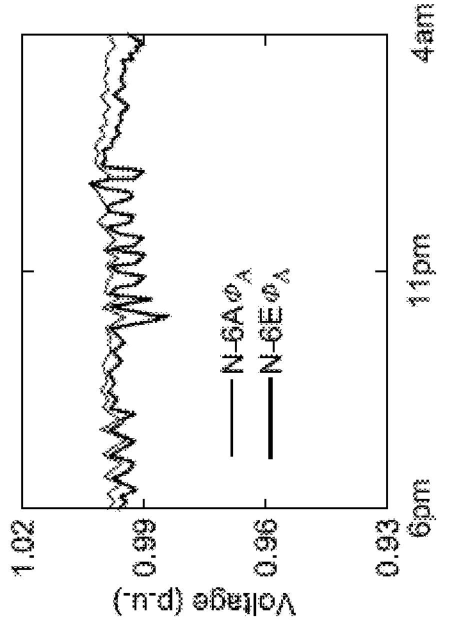
Figure 9C:
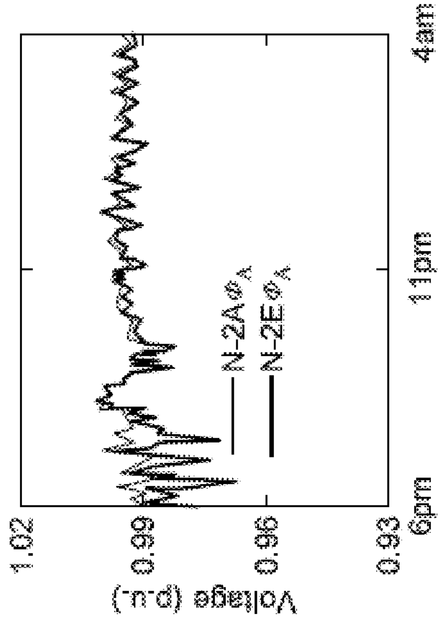
Figure 9D:
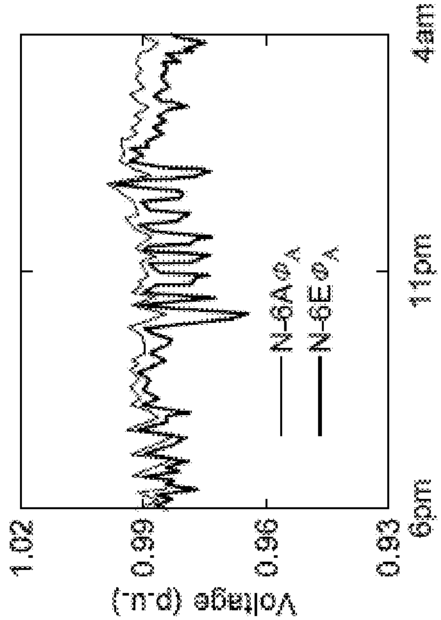
Figure 10A:
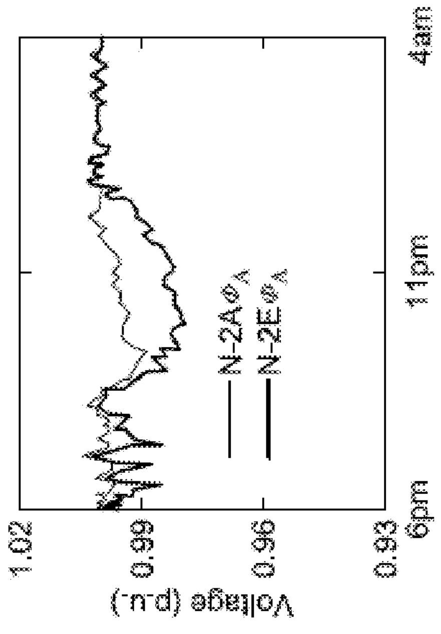
FIGS. 10A, 10B, 10C, 10D are graphs of charging voltages.
Figure 10B:
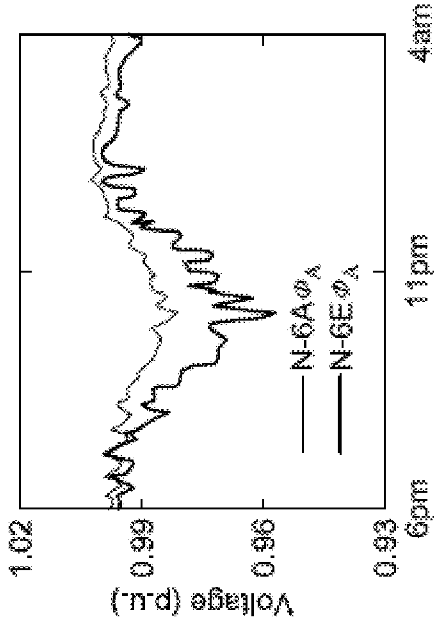
Figure 10C:
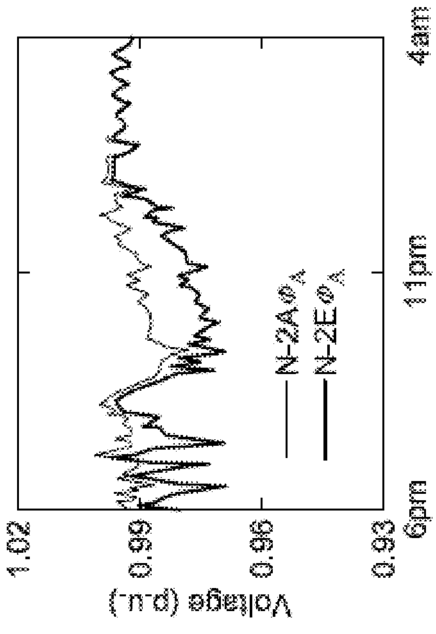
Figure 10D:
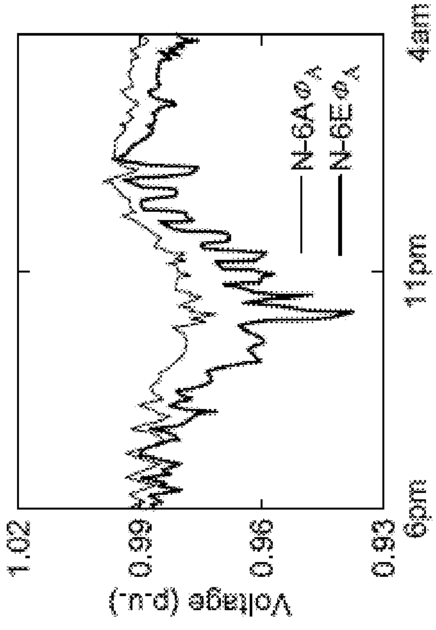
Figure 11A:
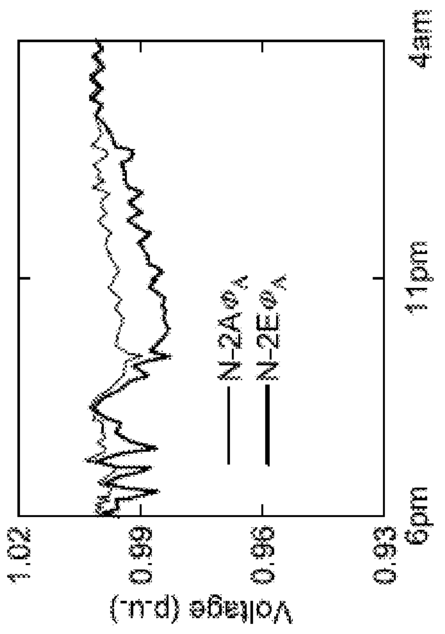
FIGS. 11A, 11B, 11C, 11D are graphs of proportional charging voltages.
Figure 11B:
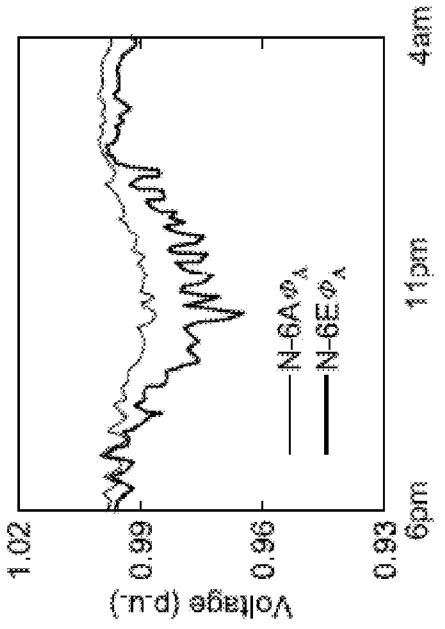
Figure 11C:
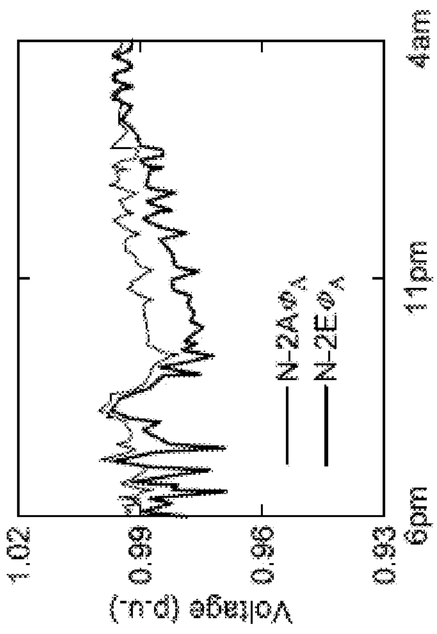
Figure 11D:
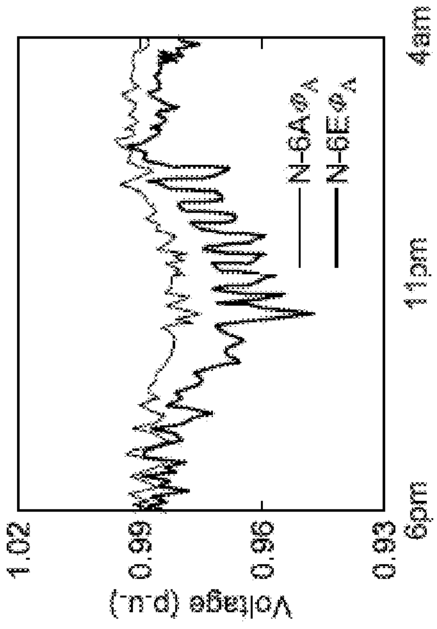

To test the effectiveness of the EV charge controller 101, the test distribution system shown in FIG. 7 was used. See A. T. Al-Awami, et al. (2016) This is an unbalanced three phase system with 17 primary nodes operating at nominal 12.47 kV. Each primary node has a three-phase 12.47/0.22-kV secondary distribution transformer. Each transformer feeds 20 houses at each phase through five laterals, as shown in FIG. 8. Key distribution system parameters are given in Table I.

Real data of several residential loads in the US with a ten-second resolution are used to generate the profiles for non-EV loads at the households. The efficacy of the EV charge controller 101 is assessed under different loading conditions such as light loading and heavy loading conditions. The purpose of these loading conditions is to take daily, monthly, and seasonal load variations into account. It is assumed that one of every two houses has an EV. The EV specifications assumed in this work are provided in Table II, which are similar to Nissan Leaf specifications. See "Nissan electric cars website, Leaf specs," 2016 (Online). Available: https://www.nissanusa.com/electric-cars/leaf/versions-specs/, incorporated herein by reference in its entirety.

TABLE I

PRIMARY AND SECONDARY DISTRIBUTION SYSTEM PARAMETERS

| Parameter | Value |
|---|---|
| Distribution phase conductor | ACSR 2 |
| Distribution neutral conductor | ACSR 4 |
| Max. current for primary conductors | 180 amperes |
| Distribution service transformer | 150 kVA |
| Secondary distribution conductor | 350 Al, 4/0 |
| System frequency | 60 Hz |
| No. of customers at each phase | 4 |

TABLE II

SPECIFICATIONS OF NISSAN LEAF MODEL SV

| Parameter | Value |
|---|---|
| Battery capacity | 30 kWh |
| Maximum charging rate | 6.6 kW |
| Initial battery SOC | 40% |
| Maximum mileage | 107 mi |

The unbalanced three-phase test distribution system described for the Test System has been simulated using DIgSILENT PowerFactory. It is assumed that the test system follows a time-of-use (TOU) tariff structure, having a lower tariff from 7 pm to 7 am. Hence, it is anticipated that EV owners will preferably charge their EVs during the low tariff period. Consequently, EVs plug-in times are assumed to follow a Gaussian distribution with a mean and a standard deviation of 8 pm and one hour, respectively.

Base Case (i.e., without EVs)

Different loading conditions are used to validate the performance of the EV charge controller 101. Since the system has many nodes, only few nodes have been selected which can provide enough details for the assessment of the controller 101. Therefore, voltages of Node-2A, Node-2E, Node-6A, and Node-6E for are shown in FIG. 9. It can be observed that Node-2A always has higher voltage than that of Node-2E (see FIGS. 9A and 9C) because these nodes are available on the same radial feeder. Similarly, Node-6A has higher voltage than Node-6E (see FIGS. 9B and 9D). Comparing voltage profiles during light and heavy loading conditions, the impact of loading on voltage drop is evident.

Opportunistic Charging

EVs start charging at their maximum charging rates in an opportunistic charging scheme once they are plugged in. See A. T. Al-Awami, et al. (June 2016). This charging process is like a constant current charger case, and it is considered as the benchmark in terms of total charging time. As shown in FIGS. 10A to 10D, no voltage violation occurs under light loading conditions. However, under heavy loading conditions, the uncontrolled charging results in an unacceptable voltage dip. This voltage dip occurs due to the addition of an ample amount of uncontrolled EV charging load.

Proportional Voltage-Based Charging

Figure 12:
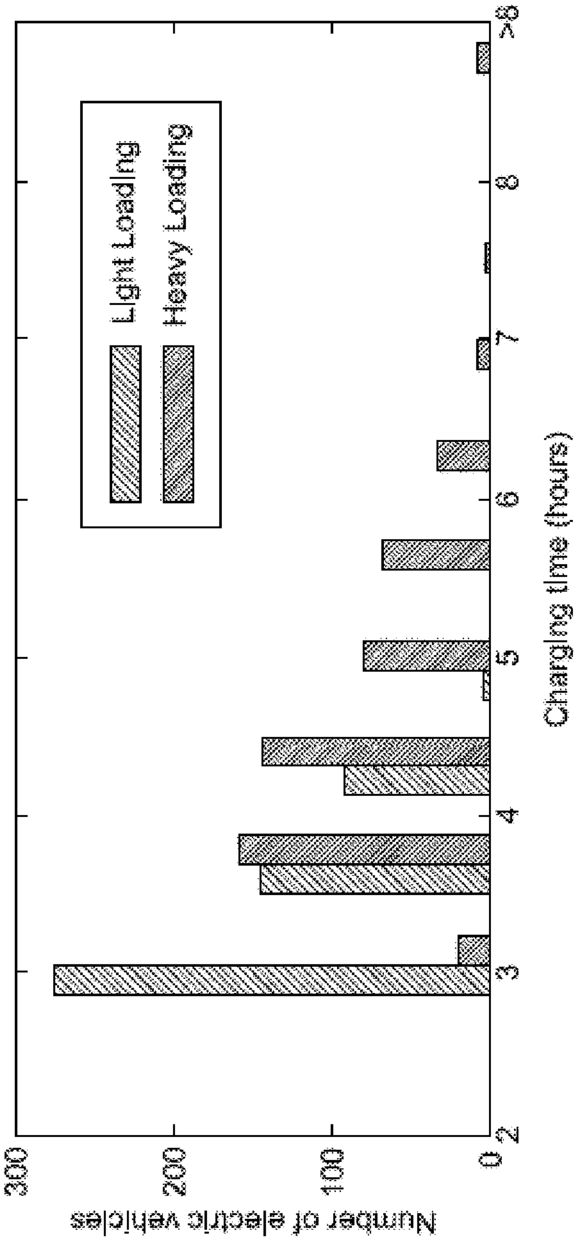
FIG. 12 is a chart of electric vehicle charging times distribution using proportional charging.
Figure 13A:
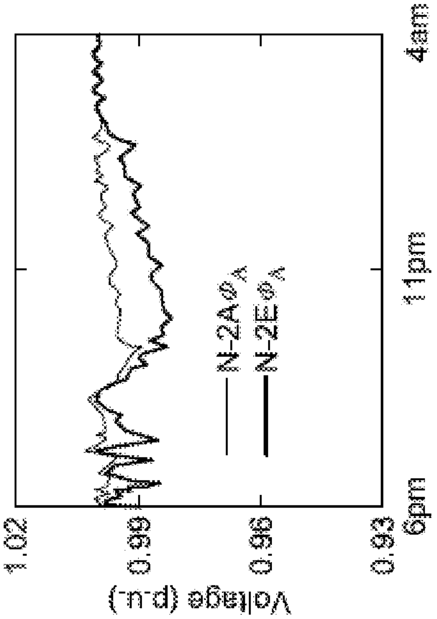
FIGS. 13A, 13B, 13C, 13D are graphs of nonlinear charging voltages.
Figure 13B:
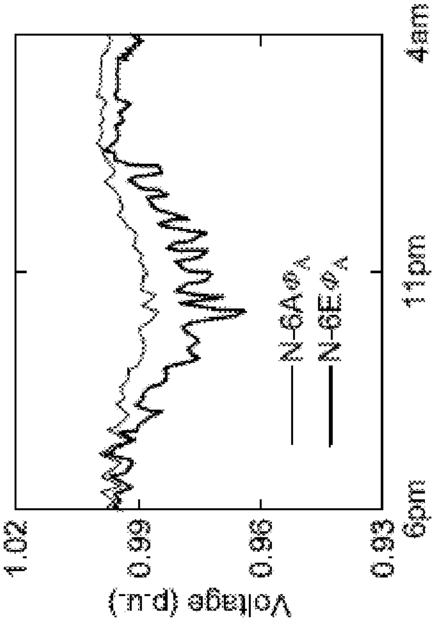
Figure 13C:
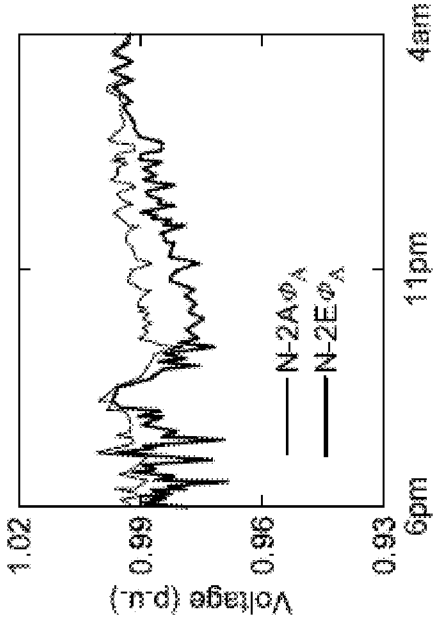
Figure 13D:
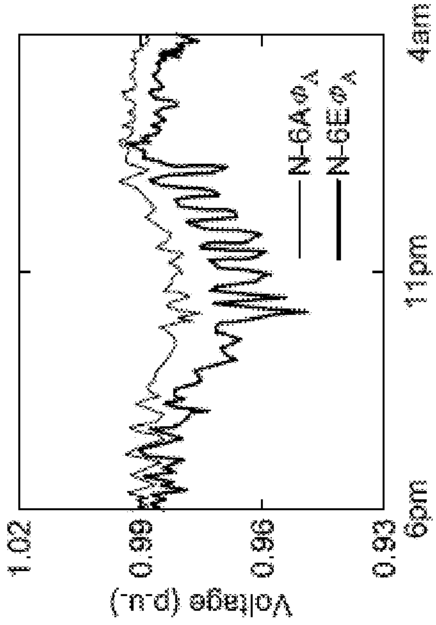

In this case, a common reference voltage is set for all the nodes and the charging rate of an EV is controlled proportionally to the difference between the nodal and the reference voltages, as given by (7). See A. T. Al-Awami et al. (2013). According to the ANSI C84.1-2006 standard, ANSI Std. C84.1 2006, the minimum allowable voltage limit is 0.95 p.u. See *American National Standard for Electrical Power Systems and Equipment—Voltage Ratings* (*60 Hertz*), incorporated herein by reference in its entirety. Therefore, considering a safety margin, the reference voltage, $v_r$, is set to 0.955 p.u. The proportional gain, $k_p$, is set at 165. Using this charging control technique, the voltages are improved considerably, compared to opportunistic charging, as shown in FIGS. 11A to 11D. In addition, FIG. 12 shows a histogram of the EVs charging times for this case. These results demonstrate the large variations in charging speed among the different EVs. This is because the upstream nodes have higher voltages than the downstream nodes. As a result, the EVs at upstream nodes are charged faster. That is, this control mechanism does not ensure fairness among EVs available at different locations in the system.

$$EP_j(t) = \begin{cases} k_p \cdot (v_i(t) - v_r), & v_i(t) \geq v_r \\ 0, & \text{else} \end{cases} \quad (7)$$

TABLE III

SAMPLE EV CHARGING TIMES WITH PROPORTIONAL CHARGING

| Nodes | Loading Condition | Min. Charging Time (h) | Max. Charging Time (h) | Avg. Charging Time (h) |
|---|---|---|---|---|
| Node-2 | Light | 2.7639 | 3.8222 | 3.2120 |
| Node-2 | Heavy | 3.0778 | 5.2278 | 4.0302 |
| Node-6 | Light | 2.8611 | 4.4778 | 3.6410 |
| Node-6 | Heavy | 3.5194 | — | — |

Nonlinear Voltage-Based Charging

Figure 14:
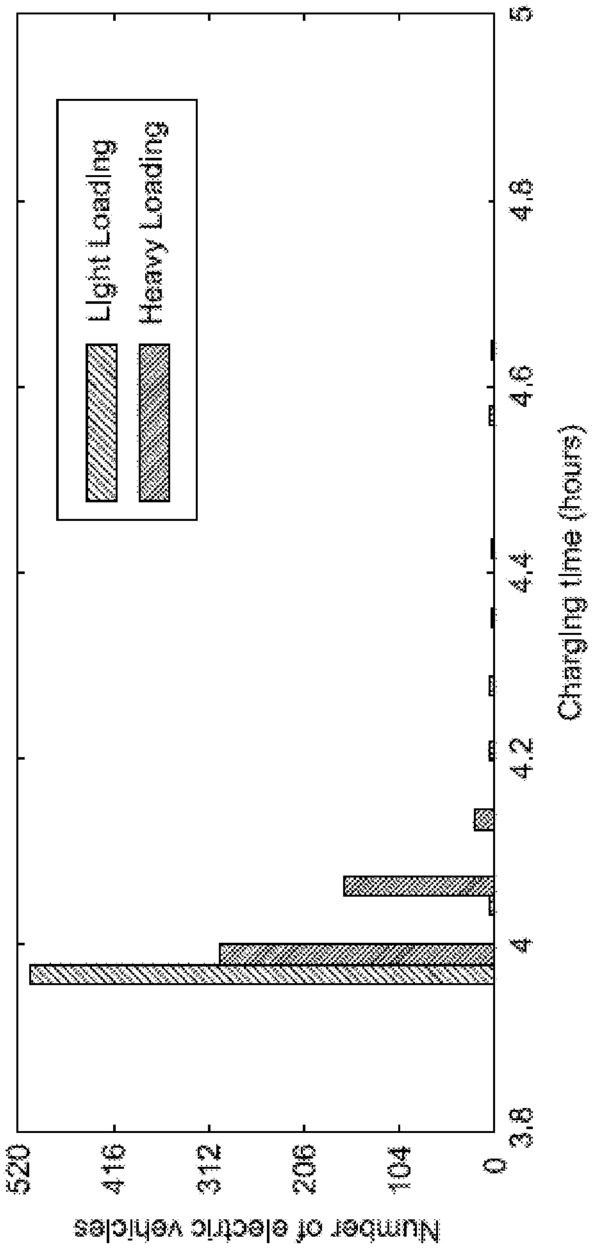
FIG. 14 is a chart of electric vehicle charging times distribution using nonlinear charging.
Figure 15A:
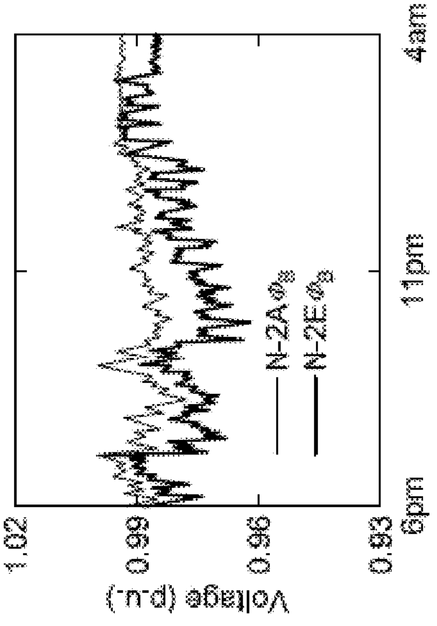
FIGS. 15A, 15B, 15C, 15D are graphs of voltages at heavy loading.
Figure 15B:
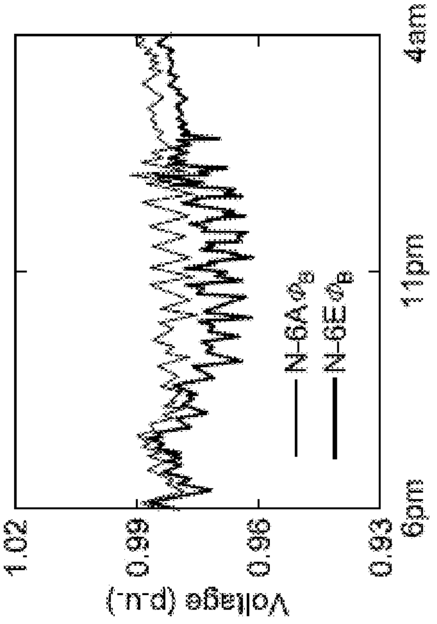
Figure 15C:
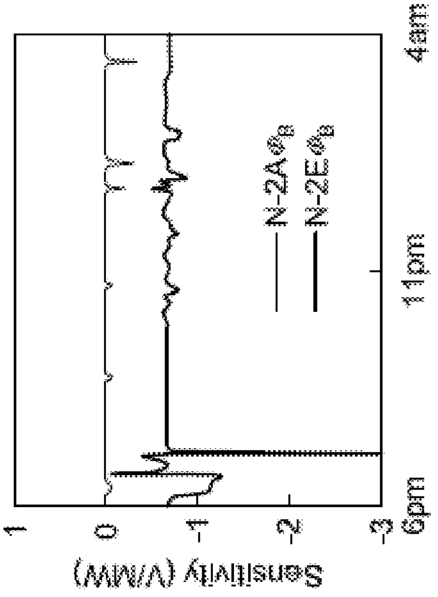
Figure 15D:
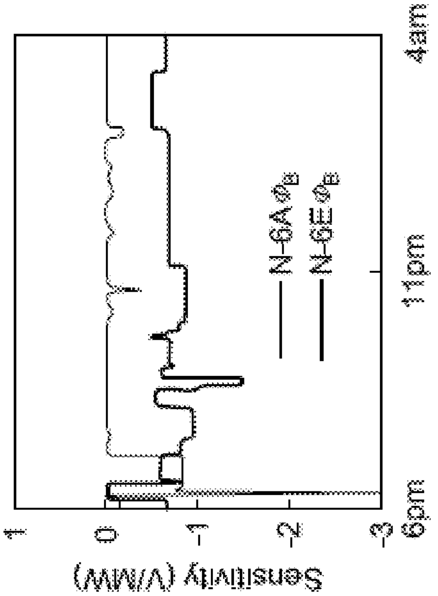

A nonlinear voltage-based EV charge controller is presented to address the issue of fairness among the EVs. See A. T. Al-Awami, et al. (June 2016). This non-linear voltage-based charge controller is considered as the benchmark regarding fairness. Using this controller, the voltage profiles of Node-2A, Node-2E, Node-6A, and Node-6E are shown in FIGS. 13A to 13D. The voltage is always above 0.95 p.u. in light loading conditions while it goes below 0.95 p.u. very briefly during heavy loading condition. Although a voltage violation exists, it occurs for a negligible duration, which is a significant improvement compared to the opportunistic charging case (compare FIGS. 10 and 13). In addition, FIG. 14 shows a histogram of the EVs charging times for this case. Moreover, Table IV shows the minimum, maximum, and average times needed to charge the EVs connected to node 2 (an upstream node) and node 6 (a downstream node). The improvement in charging fairness using this nonlinear charging compared with proportional charging is evident. See A. T. Al-Awami, et al. (June 2016). However, this control strategy is conservative. That is, there is still more room for charging the EVs faster without negatively impacting the voltage profiles.

TABLE IV

SAMPLE EV CHARGING TIMES WITH NONLINEAR CHARGING

| Nodes | Loading Condition | Min. Charging Time (h) | Max. Charging Time (h) | Avg. Charging Time (h) |
|---|---|---|---|---|
| Node-2 | Light | 3.9500 | 3.9944 | 3.9724 |
| Node-2 | Heavy | 3.9722 | 4.0333 | 4.0020 |
| Node-6 | Light | 3.9667 | 4.0167 | 3.9897 |
| Node-6 | Heavy | 3.9944 | 4.2639 | 4.0550 |

EV Charge Controller Voltage-and Sensitivity-Based Charging

In the EV charge controller 101, both the nodal voltage and voltage-to-load sensitivity are used to determine the EV charging rate in a fair and less conservative manner. A node having a higher voltage (i.e., strong or upstream node) is less sensitive to change in load than that having a lower voltage (i.e., weak or downstream node). In fact, if the same amount of power is to be delivered to two different load points, the farther load point will have lower voltage because the voltage drop across the longer feeder will be higher, provided that the feeders are of the same type. Similarly, the same amount of change in load at these two load points will cause higher voltage change at the farther load point; hence, it becomes more sensitive. This is depicted in FIGS. 15A to 15D for sample secondary nodes on the system. Both nodes 2A and 2E are connected to primary node 2. The voltages at phase B of both nodes are shown in FIG. 15. Note that node Node-2A is connected directly to the service transformer with a lateral of negligible length. Node-2E, however, is connected to the same transformer by a 100-ft lateral. That is, Node-2E is more downstream than Node-2A. Hence, Node-2E is expected to be more sensitive to load changes than Node-2A. The voltage and sensitivity comparisons given in FIGS. 15A and 15C confirm these relations. Similarly, the voltage and sensitivities of nodes 6A and 6E are given in FIGS. 15B and 15D, respectively.

Figure 16:
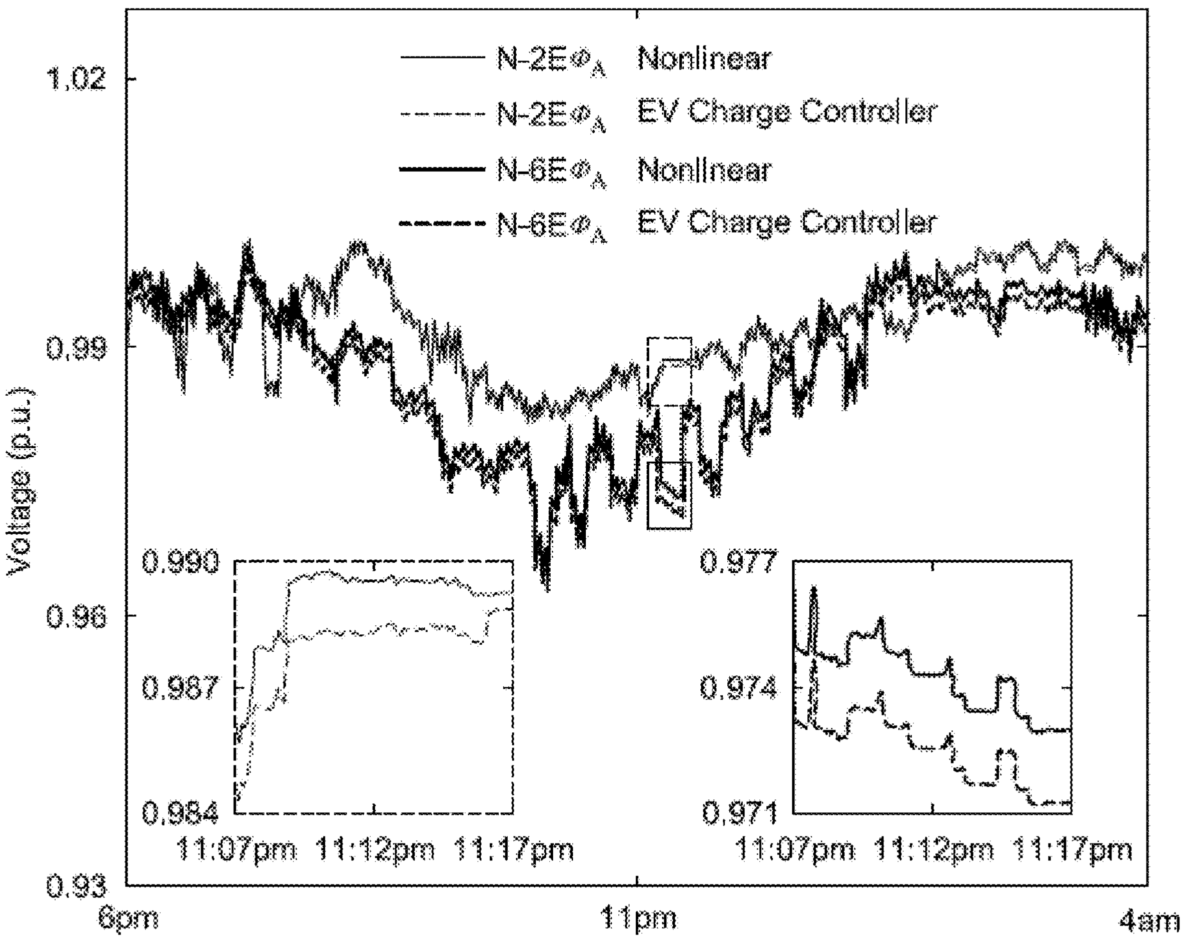
FIG. 16 is a graph of voltage comparison in a light loading condition.
Figure 17:
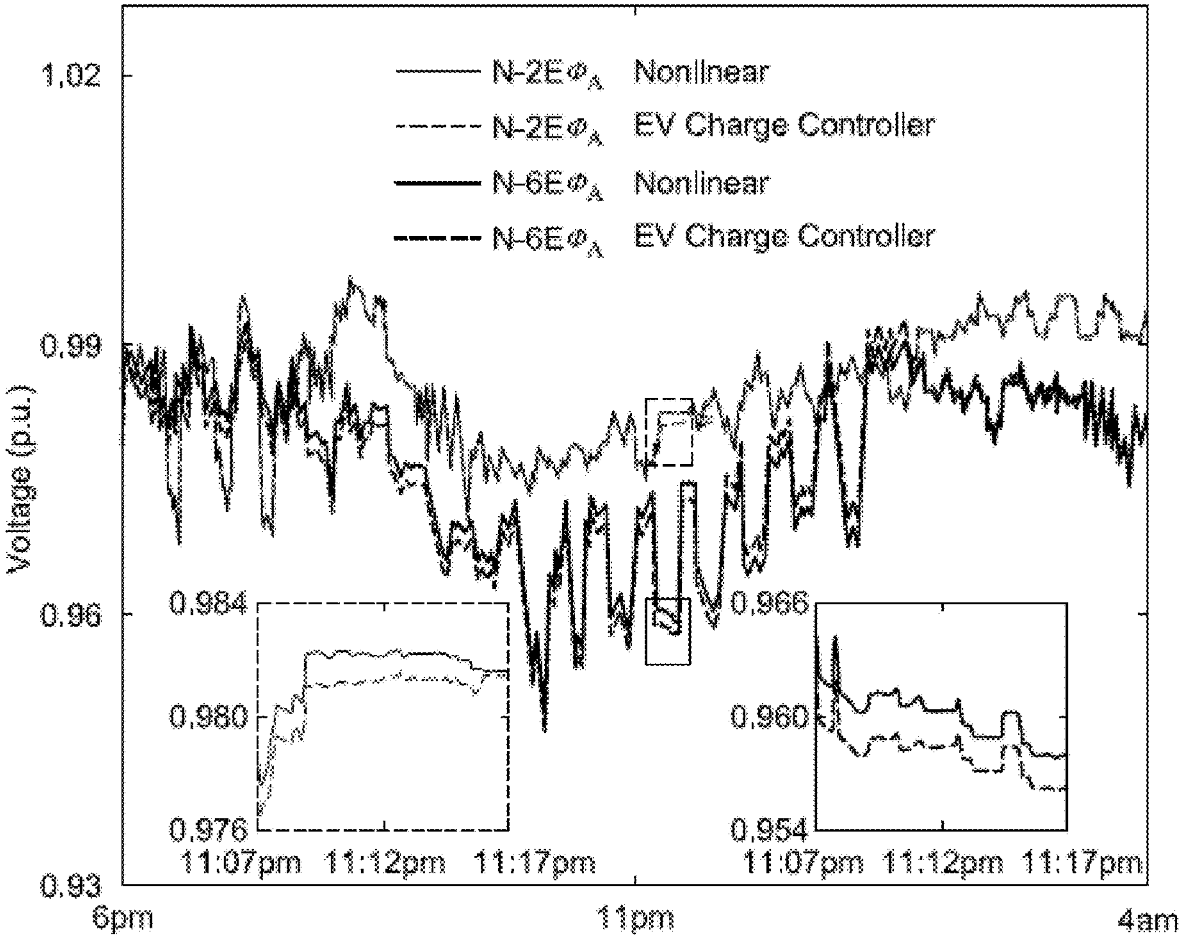
FIG. 17 is a graph of voltage comparison in a heavy loading condition.

The voltages at different nodes for light and heavy loading conditions using the nonlinear controller and EV charge controller 101 are shown in FIGS. 16 and 17, respectively. These figures reveal how the EV charge controller 101 is less conservative than the nonlinear controller as soon as the nodal voltages recover.

Figure 18:
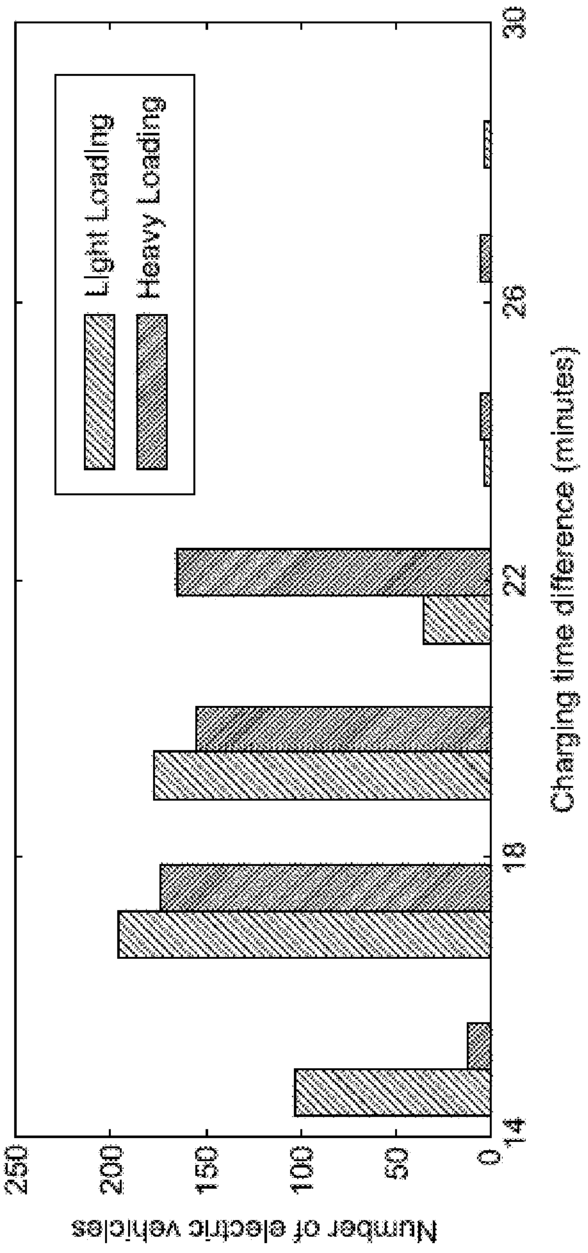
FIG. 18 is a chart of charging time difference between proposed and voltage feedback controllers.
Figure 19:
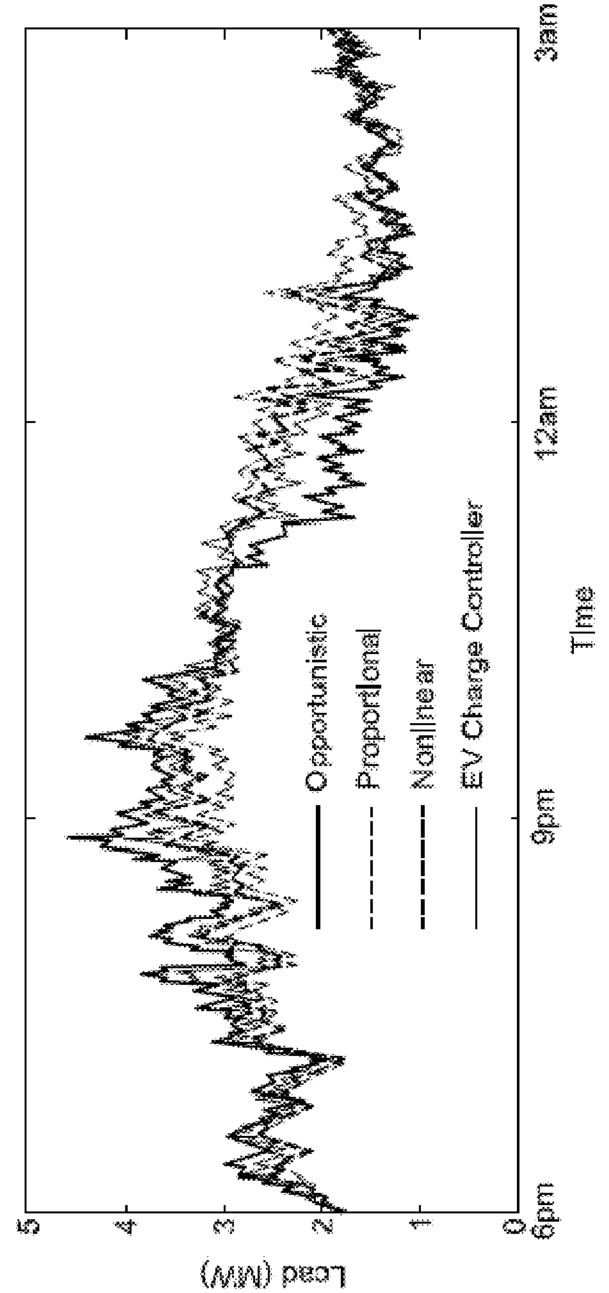
FIG. 19 is a graph of total system load using the histogram of charging time difference between proposed and voltage feedback controllers.
Figure 20A:
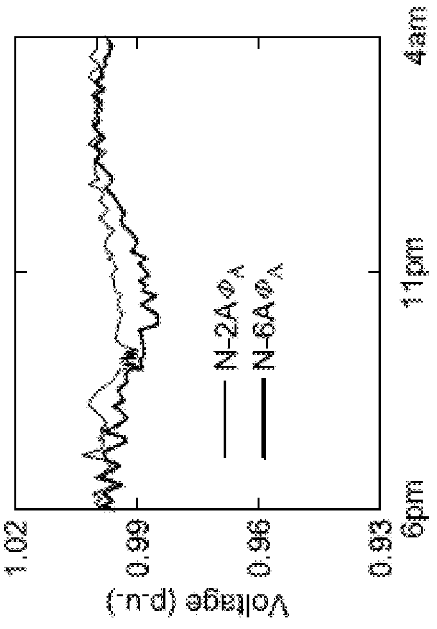
FIGS. 20A, 20B, 20C, 20D are graphs of voltages under end-of-charge time preferences.
Figure 20B:
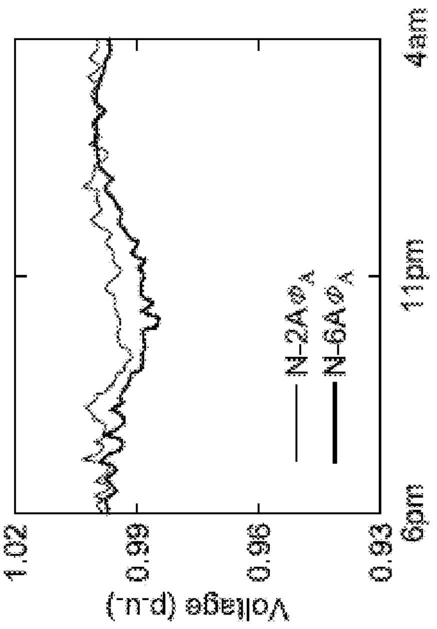
Figure 20C:
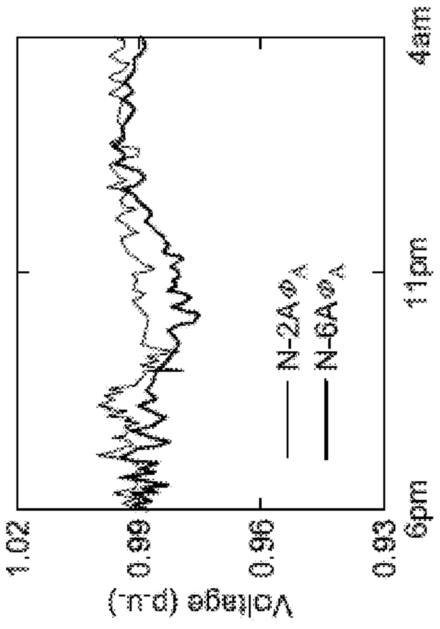
Figure 20D:
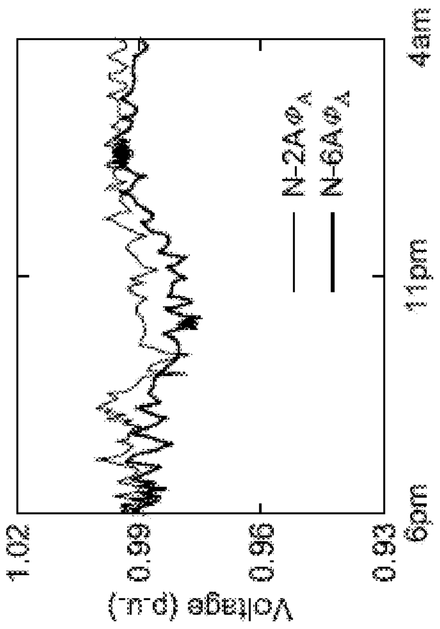

In addition, Table V shows the minimum, maximum, and average times needed to charge the EVs connected to node 2 and node 6 using the EV charge controller 101. Comparing Table V to Table IV verifies that the EV charge controller 101 charges the EVs faster than the nonlinear controller. The distribution of EV charging time difference between both controllers is shown in FIG. 18. As shown in FIG. 19, evidently all EVs are charging faster using the EV charge controller 101. The minimum improvement in charging time is about 14 minutes. For some EVs, the improvement in charge time is almost half an hour. A comparison of peak system load is shown in Table VI.

TABLE V

CHARGING TIME WITH EV CHARGE CONTROLLER

| Nodes | Loading Condition | Min. Charging Time (h) | Max. Charging Time (h) | Avg. Charging Time (h) |
|---|---|---|---|---|
| Node-2 | Light | 3.6500 | 3.7139 | 3.6842 |
| Node-2 | Heavy | 3.6694 | 3.7139 | 3.6914 |
| Node-6 | Light | 3.6444 | 3.7139 | 3.6817 |
| Node-6 | Heavy | 3.6417 | 3.8417 | 3.7211 |

TABLE VI

PEAK SYSTEM LOAD COMPARISON

| Controllers | Peak System Load (MW) |
|---|---|
| Opportunistic | 4.664 |
| Proportional | 3.593 |
| Nonlinear | 4.010 |
| EV CHARGE | 4.154 |

Control Scheme Performance

The performance of the voltage- and sensitivity-based control scheme for EV charging is further examined. Table VII shows the total power losses on the distribution system using the proposed control scheme. For comparison, the system losses obtained using uncontrolled charging are also included. These results indicate that the proposed control scheme can effectively reduce the system power losses.

TABLE VII

REAL POWER LOSSES COMPARISON

| Controllers | Loading Condition | Real Power Losses (kWh) | % Reduction in Losses* |
|---|---|---|---|
| Opportunistic | Light | 209.0 | — |
| | Heavy | 362.4 | — |
| EV CHARGE | Light | 194.9 | 6.75% |
| | Heavy | 346.4 | 4.42% |

*Compared to losses using opportunistic charging

Figure 21:
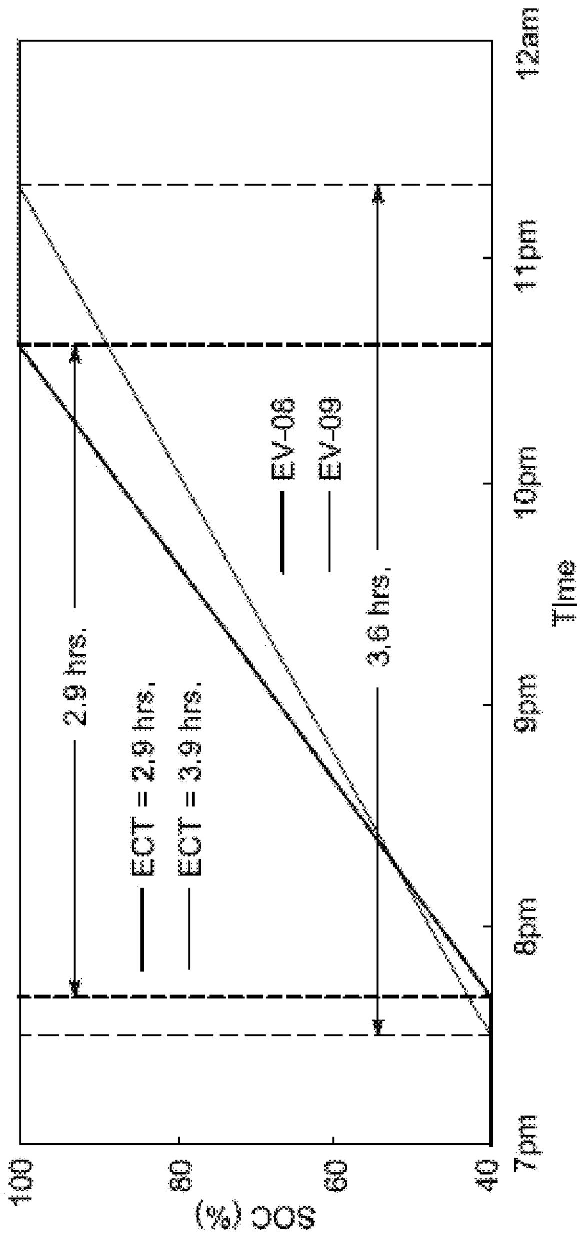
FIG. 21 is a graph of state of charge of electric vehicles with end-of-charge time preferences under light loading conditions.

In addition, the performance of the control scheme is assessed when ECT preferences of EV owners are considered. It is assumed that 20% of EV owners have determined their ECT preferences. A uniformly distributed random number between 2.75 and 4 hours is generated for each of these EVs. FIGS. 20A to 20D show the corresponding voltage profiles of phase A at nodes 2A and 6A. Additionally, the SOCs of two sample EVs (EV-8 and EV-9) with preferred ECT available at Node-2B are shown in FIG. 21. EV-8 is requested to charge within 2.9 hours while EV-9 is requested to charge within 3.9 hours. Both requested have been accommodated. In fact, EV-9 has been charged earlier than its requested charge time.

Figure 22A:
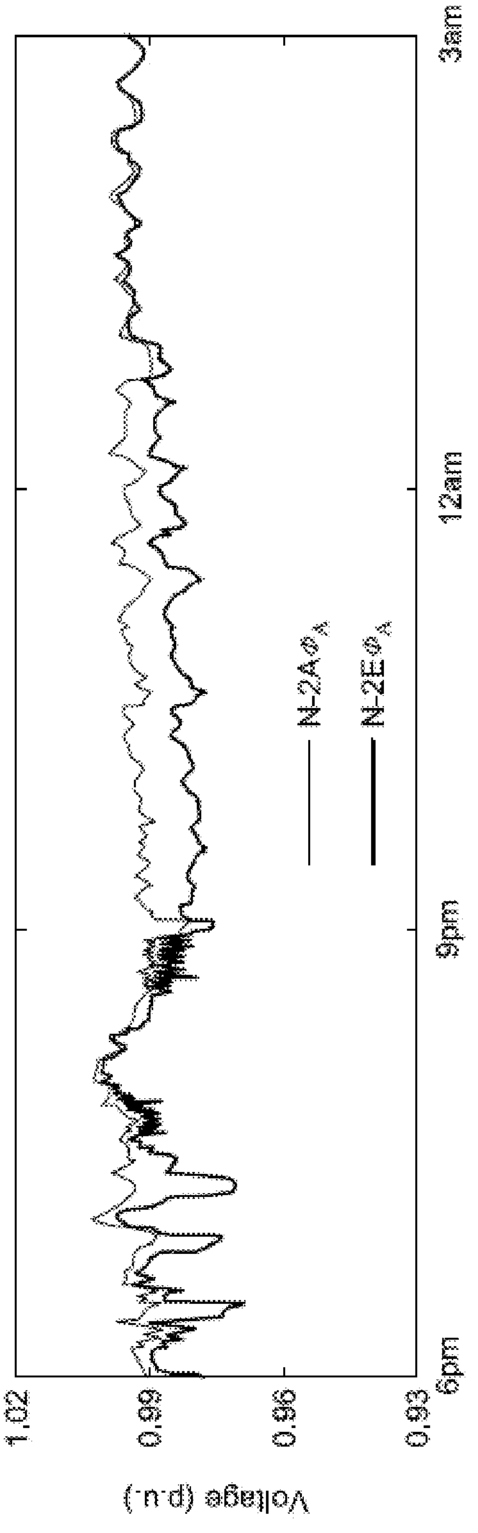
FIGS. 22A and 22B are a graph of voltages after removing nodes.
Figure 22B:
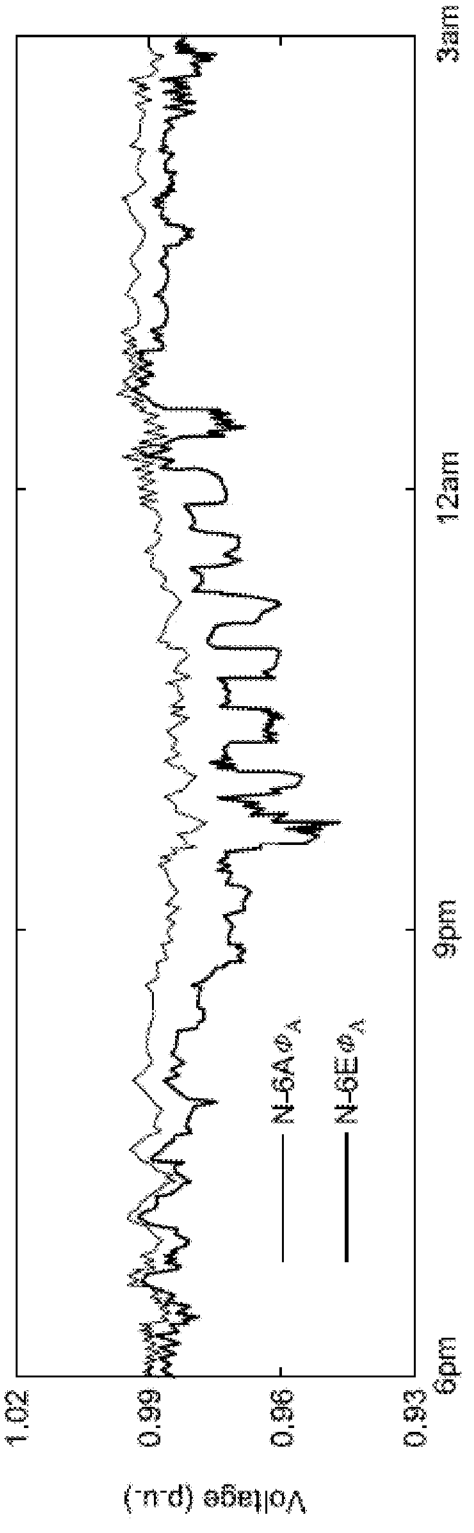

The performance of the EV charge controller 101 is also assessed under probable system reconfiguration. A significant reconfiguration event is assumed, at which nodes 10-18 are removed during heavy loading conditions. The charging time statistics results are summarized in Table VIII for the EVs at nodes 2 and 6. These results indicate that the EV charge controller 101 still ensures charging fairness among all EVs, which proves the robustness of the controller. The voltages after removing nodes 10-18 at nodes 2 and 6 during heavy loading are shown in FIGS. 22A and 22B, respectively.

TABLE VIII

| CHARGING TIME WITH NODES 10-18 REMOVED | | | |
|---|---|---|---|
| Node | Min. Charging Time (h) | Max. Charging Time (h) | Avg. Charging Time (h) |
| Node-2 | 3.6667 | 3.7139 | 3.6898 |
| Node-6 | 3.6556 | 3.7194 | 3.6928 |

Figure 23:
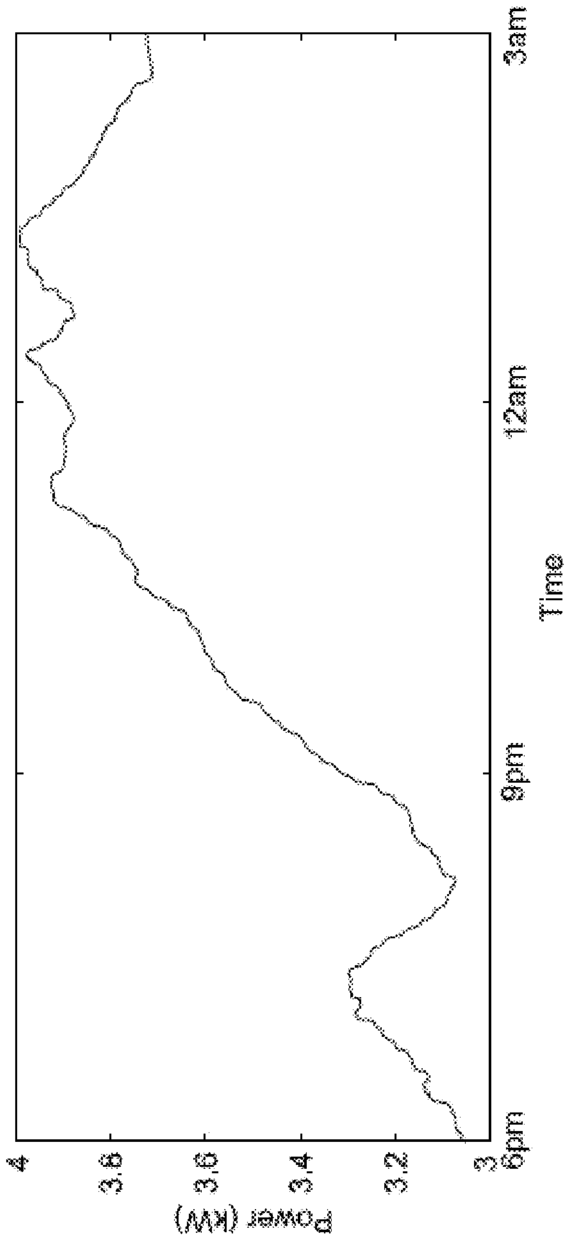
FIG. 23 is a graph of a wind power profile.

Because DG units have been commonly installed at the secondary distribution system, it is important to test the EV charge controller 101 when DG units are included. Therefore, micro-wind turbines are assumed to be installed at some of the houses at Node-6E (phase A). The wind power output profile used is given in FIG. 23. The rated capacity of a single DG is assumed to be 4 kW. It can clearly be seen from Table IX that the inclusion of DGs improve the charging time of EVs during heavy loading conditions. This is because the power injected by the DGs improves the voltage profiles at and around those POCs. However, at light loading, the charging rates have not improved because the voltages were already good even without the DGs. Moreover, Table X shows the minimum, maximum, and average times needed to charge the EVs connected to node 2 and node 6 when DG units are installed at Node-6E (phase A).

TABLE IX

| COMPARISON WITH AND WITHOUT THE INCLUSION OF DGS | | |
|---|---|---|
| Cases | Loading Condition | Average Charging Time at Node-6E ($\varphi_A$) |
| Without DGs | Light | 3.6611 hrs. |
| | Heavy | 3.8556 hrs. |
| With DGs | Light | 3.6403 hrs. |
| | Heavy | 3.6750 hrs. |

TABLE X

| CHARGING TIME WITH DGS AT NODE-6E ($\Phi_A$) | | | |
|---|---|---|---|
| Node | Min. Charging Time (h) | Max. Charging Time (h) | Avg. Charging Time (h) |
| Node-2 | 3.6694 | 3.7139 | 3.6926 |
| Node-6 | 3.6528 | 3.8000 | 3.7028 |

Figure 24A:
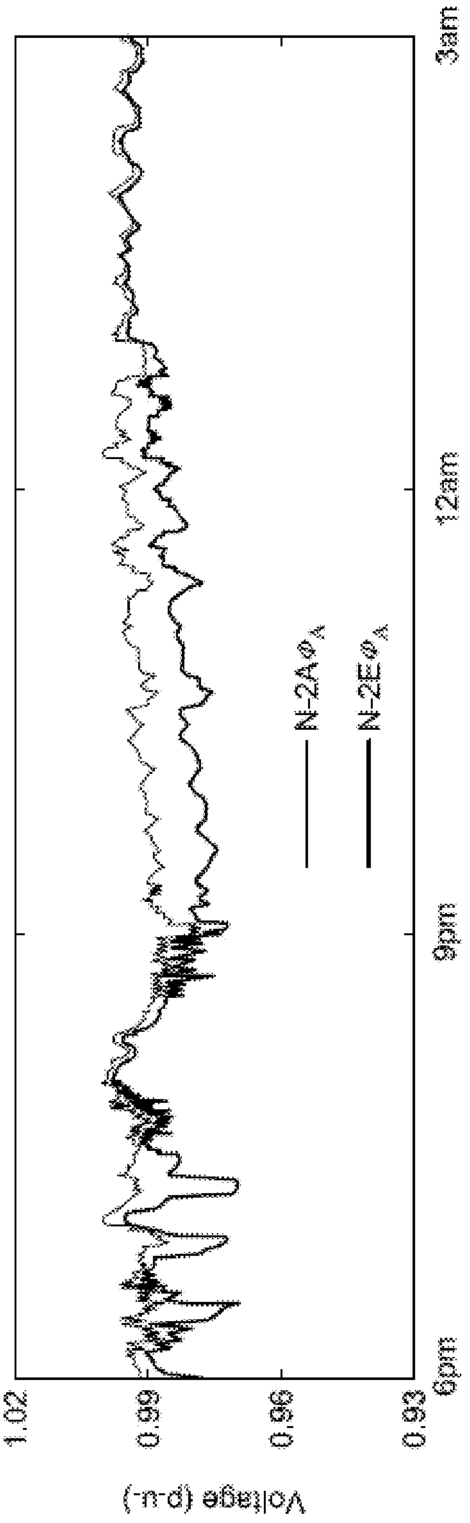
FIGS. 24A and 24B are a graph of voltages with shunt capacitors.
Figure 24B:
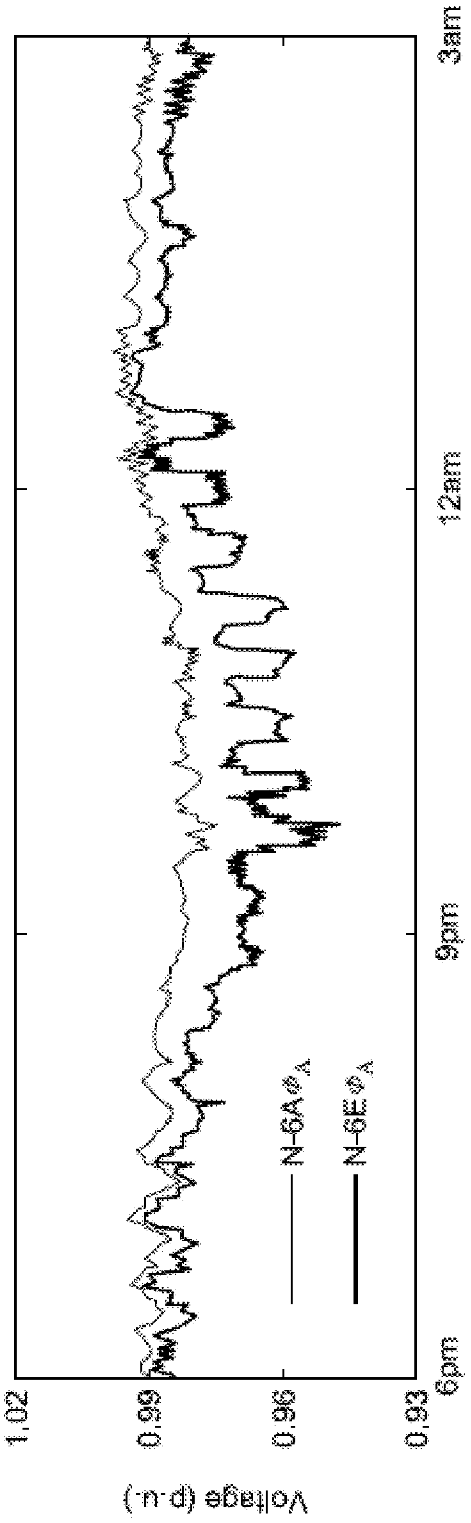

To further assess the robustness of the EV charge controller 101, a shunt capacitor of value 1 MVar is installed at Node-5A. The results are tabulated in Table XI. It can clearly be seen that the inclusion of the shunt capacitor improves the charging times for both light and heavy loading conditions. The EV charge controller 101 still works effectively which proves the efficacy of the controller. The voltage profiles at nodes 2 and 6 are shown in FIGS. 24A and 24B,respectively, when shunt capacitor is installed. The minimum, maximum, and average times needed to charge the EVs connected to node 2 and node 6 are tabulated in Table XII.

TABLE XI

| COMPARISON WITH AND WITHOUT THE INCLUSION OF SHUNT CAPACITOR | | |
|---|---|---|
| Cases | Loading Condition | Average Charging Time at Node-6 |
| Without Shunt | Light | 3.6884 hrs. |
| Capacitor | Heavy | 3.7459 hrs. |
| With Shunt | Light | 3.6840 hrs. |
| Capacitor | Heavy | 3.6862 hrs. |

TABLE XII

| CHARGING TIME WITH SHUNT CAPACITOR AT NODE-5A | | | |
|---|---|---|---|
| Node | Min. Charging Time (h) | Max. Charging Time (h) | Avg. Charging Time (h) |
| Node-2 | 3.6694 | 3.7139 | 3.6919 |
| Node-6 | 3.6417 | 3.7639 | 3.7039 |

In disclosed embodiments, an online measuring sensitivity of voltage to load changes is provided to implement an autonomous communication-free electric vehicle (EV) charge controller. The voltage and sensitivity are considered as input signals while the charging rate is an output of EV charge controller. The state-of-charge (SOC) of EV battery is also included in the charging control structure to adjust the charging rate of an EV. Furthermore, the owner's end-of-charge time (ECT) preference is included in the control structure to facilitate the EV owners with quick charging option. The EV charge controller is employed in a test distribution system. The performance of the proposed EV charge controller is evaluated under light and heavy loading conditions to model the daily, weekly, monthly, and seasonal variations.

The EV charge controller ensures the fairness among the EVs available at upstream, midstream, and downstream nodes as well as squeezes the system to higher capacity while avoiding voltage violations due to the EV charging load. The performance of the controller, when system is subjected to probable topology reconfiguration, proves the efficacy of the proposed controller. The robustness of controller is tested by integrating distributed generators (DGs), and shunt capacitors (SC), into the test distribution system. Simulation results prove the effectiveness of the disclosed approach and substantiate the fact that the nodes having strong voltage profiles are less voltage-sensitive to change in load, and vice versa. In fact, these complementary characteristics play a significant role in ensuring the fairness among the EVs available at upstream, midstream, and downstream nodes. Hence, the controller structure charges all the EVs almost at the same rate irrespective of their charging locations in the power system.

Numerous modifications and variations of the present invention are possible in light of the above teachings. It is therefore to be understood that within the scope of the appended claims, the invention may be practiced otherwise than as specifically described herein.

The invention claimed is:

1. An autonomous charge controller for controlling a charging rate for at least one battery of an electric vehicle without communication with a power distribution grid, the at least one battery receiving charge via a node connected to the power distribution grid, the charge controller comprising:

circuitry configured to receive a nodal voltage measurement for voltage at the node, receive a value of electric power at the node, determine a change in the electric power value based on a previous power value at a previous time, when the change in electric power is greater than a load change threshold, determine an estimate of voltage-to-load sensitivity, determine the charging rate of the electric vehicle based on the nodal voltage, the determined voltage-to-load sensitivity, and a state of charge of the at least one battery, and control the charging rate for the at least one battery in accordance with the determined charging rate.

2. The charge controller of claim 1, wherein the circuitry is configured to determine the estimate of the voltage-to-load sensitivity based on a complementary relationship between the nodal voltage and voltage sensitivity at the node.

3. The charge controller of claim 2, wherein the complementary relationship used by the circuitry to determine the estimate of the voltage-to-load sensitivity is a ratio of a change in the nodal voltage and the change in electric power with respect to a previous periodic interval.

4. The charge controller of claim 1, further comprising:

a voltage measurement device for measuring the nodal voltage;

a current measurement device for measuring the current; and a state of charge measurement device for detecting the state of charge of the at least one battery.

5. The charge controller of claim 1, wherein the load change threshold is 10% of the power value before the power change.

6. The charge controller of claim 1, wherein the circuitry is further configured to determine the charging rate of the electric vehicle based on the measured nodal voltage, the voltage-to-load sensitivity at the previous periodic interval, and the battery state of charge when the determined estimate of the voltage-to-load sensitivity is negative.

7. The charge controller of claim 1, wherein the circuitry is further configured to receive a battery capacity, the battery state of charge and departure time, determine an uncharged battery capacity using the battery capacity and the battery state of charge, and determine charging rate of the electric vehicle based on the uncharged battery capacity and the departure time.

8. The charge controller of claim 1, wherein the circuitry is further configured to limit the charging rate to not to exceed a maximum charging rate.

9. The charge controller of claim 1, wherein the circuitry is further configured to charge the electric vehicle at an increased rate based on an exponential function when the state of charge is below a predetermined level.

10. The charge controller of claim 1, wherein the circuitry is configured to determine the charging rate of the electric vehicle EP(t) as follows $$EP_j(t) = \begin{cases} a_j + \{\beta_j \cdot e^{-(\mu_i(t))(v_i(t)-v_r)}\} \cdot e^{(1-\lambda_j)}, & v_i(t) \geq v_r \\ 0, & \text{else} \end{cases}$$

where $\mu_i(t)$ is the estimate of voltage-to-load sensitivity, $v_i(t)$ is the nodal voltage, $\alpha_j$ is a minimum charging rate, $v_r$ is a reference voltage, $\lambda_j$ is a per unit SOC of the EV, and $\beta_j$ is a controller parameter, for vehicle j at interval i.

11. The charge controller of claim 1, wherein the circuitry is configured to control the charging rate of the electric vehicle to be substantially the same as other nodes that are connected to the power distribution source having substantially the same state of charge.

12. An autonomous charge control method for controlling a charging rate for at least one battery of an electric vehicle without communication with a power distribution grid, the at least one battery receiving charge via a node connected to the power distribution grid, the method comprising:

circuitry performing receiving a nodal voltage measurement for voltage at the node;

receiving a value of electric power at the node;

determining a change in the electric power value based on a previous power value at a previous time;

when the change in electric power is greater than a load change threshold, determining an estimate of voltage-to-load sensitivity;

determining the charging rate of the electric vehicle based on the nodal voltage, the determined voltage-to-load sensitivity, and a state of charge of the at least one battery; and controlling the charging rate for the at least one battery in accordance with the determined charging rate.

13. The charge control method of claim 12, wherein the determining the estimate of the voltage-to-load sensitivity is performed by the circuitry in accordance with a complementary relationship between the nodal voltage and voltage sensitivity at the node.

14. The charge control method of claim 13, wherein the estimate of the voltage-to-load sensitivity is determined by the circuitry as a ratio of a change in the nodal voltage and the change in electric power.

15. The charge control method of claim 12, further comprising:

measuring the nodal voltage by a voltage measurement device;

measuring the current by a current measurement device; and detecting the state of charge of the at least one battery by a state of charge measurement device.

16. The charge control method of claim 12, further comprising:

when the determined estimate of the voltage-to-load sensitivity is negative, determining, by the circuitry, the charging rate of the electric vehicle based on the measured nodal voltage, the voltage-to-load sensitivity at the previous periodic interval, and the battery state of charge.

17. The charge control method of claim 12, further comprising:

the circuitry receiving battery capacity, the battery state of charge and departure time;

determining an uncharged battery capacity using the battery capacity and the battery state of charge; and determining the charging rate of the electric vehicle based on the uncharged battery capacity and the departure time.

18. The charge control method of claim 12, further comprising:

limiting, by the circuitry, the charging rate to not to exceed a maximum charging rate.

19. The charge control method of claim 12, further comprising:

charging, by the circuitry, the electric vehicle at an increased rate based on an exponential function when the state of charge is below a predetermined level.

20. The charge control method of claim 12, wherein the determining the charging rate of the electric vehicle EP(t) is performed by the circuitry in accordance with $$EP_j(t) = \begin{cases} \alpha_j + \{\beta_j \cdot e^{-(\mu_i(t))(v_i(t)-v_r)}\} \cdot e^{(1-\lambda_j)}, & v_i(t) \geq v_r \\ 0, & \text{else} \end{cases}$$

where $\mu_i(t)$ is the estimate of voltage-to-load sensitivity, $v_i(t)$ is the nodal voltage, $\alpha_j$ is a minimum charging rate, $v_r$ is a reference voltage, $\lambda_j$ is a per unit SOC of the EV, and $\beta_j$ is a controller parameter, for vehicle j at interval i.

* * * * *